(12) United States Patent
Ouchi et al.

(10) Patent No.: US 7,560,145 B2
(45) Date of Patent: *Jul. 14, 2009

(54) CURING AGENT, CURABLE COMPOSITIONS, COMPOSITIONS FOR OPTICAL MATERIALS, OPTICAL MATERIALS, THEIR PRODUCTION AND LIQUID CRYSTAL DISPLAYS AND LED'S MADE BY USING THE MATERIALS

(75) Inventors: Katsuya Ouchi, Settsu (JP); Manabu Tsumura, Settsu (JP); Michinori Tsukamoto, Ibaraki (JP); Harumi Sakamoto, Settsu (JP); Kazunori Yokoyama, Settsu (JP)

(73) Assignee: Kaneka Corporation, Osaka-Shi (JP)

( * ) Notice: Subject to any disclaimer, the term of this patent is extended or adjusted under 35 U.S.C. 154(b) by 137 days.

This patent is subject to a terminal disclaimer.

(21) Appl. No.: 10/433,981

(22) PCT Filed: Dec. 10, 2001

(86) PCT No.: PCT/JP01/10802

§ 371 (c)(1),
(2), (4) Date: Oct. 23, 2003

(87) PCT Pub. No.: WO02/053648

PCT Pub. Date: Jul. 11, 2002

(65) Prior Publication Data

US 2004/0126504 A1 Jul. 1, 2004

(30) Foreign Application Priority Data

Dec. 27, 2000 (JP) ............................. 2000-398382
Feb. 14, 2001 (JP) ............................. 2001-037225
Feb. 14, 2001 (JP) ............................. 2001-037226

(51) Int. Cl.
C08G 77/08 (2006.01)
C08G 77/12 (2006.01)
C08G 77/14 (2006.01)
C08G 77/26 (2006.01)
C07F 7/08 (2006.01)
C07F 7/10 (2006.01)
C09K 19/00 (2006.01)

(52) U.S. Cl. .................... 428/1.1; 428/1.52; 428/1.55; 428/447; 525/100; 525/478; 525/479; 528/34; 528/35; 556/460

(58) Field of Classification Search ............ 544/1, 544/180, 215, 216, 219, 221; 252/299.01; 428/1.52, 1.55, 447; 525/100, 478, 479; 528/34, 35; 556/460

See application file for complete search history.

(56) References Cited

U.S. PATENT DOCUMENTS

| | | | | |
|---|---|---|---|---|
| 3,892,643 A | * | 7/1975 | Tanaka et al. | 522/167 |
| 4,855,378 A | * | 8/1989 | Pradl et al. | 528/26 |
| 5,101,029 A | * | 3/1992 | Stapp et al. | 544/221 |
| 5,208,289 A | * | 5/1993 | Takarada et al. | 525/100 |
| 5,580,925 A | * | 12/1996 | Iwahara et al. | 525/100 |
| 5,691,435 A | * | 11/1997 | Herzig et al. | 528/15 |
| 5,773,532 A | * | 6/1998 | Okaniwa et al. | 525/479 |
| 6,093,782 A | * | 7/2000 | Herzig et al. | 528/15 |
| 7,371,462 B2 | * | 5/2008 | Tsumura et al. | 428/447 |
| 7,470,457 B2 | * | 12/2008 | Tsumura et al. | 428/1.6 |
| 2003/0144420 A1 | * | 7/2003 | Tsumura et al. | 525/100 |
| 2005/0209400 A1 | * | 9/2005 | Tsumura et al. | 525/100 |

FOREIGN PATENT DOCUMENTS

| | | | |
|---|---|---|---|
| EP | 0 803 529 A1 | | 10/1997 |
| JP | SHO 50 100 | | 1/1975 |
| JP | 03-095266 | * | 4/1991 |
| JP | 3-95266 A | | 4/1991 |
| JP | 3-277645 A | | 12/1991 |
| JP | 5-295270 A | | 11/1993 |
| JP | 7-3030 A | | 1/1995 |
| JP | 7-62103 A | | 3/1995 |
| JP | 8-157720 A | | 6/1996 |
| JP | 9-291214 A | | 11/1997 |
| JP | 9-302095 A | | 11/1997 |
| JP | 11-269271 | | 10/1999 |
| JP | 2000-136275 | | 5/2000 |
| JP | 2000-231003 | | 8/2000 |
| WO | WO 01/81475 | * | 11/2001 |

OTHER PUBLICATIONS

English language abstract of Takanao.*
Office Action issued in counterpart Japanese Patent Application No. 2001-376317, dated Jul. 17, 2007.

* cited by examiner

*Primary Examiner*—Shean C Wu
(74) *Attorney, Agent, or Firm*—Kenyon & Kenyon LLP

(57) ABSTRACT

The invention aims at a curing agent, curable compositions or compositions for optical materials, capable of providing for cured artifacts having laudable heat resistance, optical transparency, and light resistance; optical materials and methods for their production; and liquid crystal displays and LED's made by using the materials. A curing agent, which comprises at least two SiH groups, is obtainable by subjecting an aliphatic organic compound (α1) and an acyclic and/or cyclic polyorganosiloxane (β1) to hydrosilylation reaction. The curing agent is also obtainable by subjecting an organic compound (α2) and a cyclic polyorganosiloxane (β2) to hydrosilylation reaction.

28 Claims, No Drawings

CURING AGENT, CURABLE COMPOSITIONS, COMPOSITIONS FOR OPTICAL MATERIALS, OPTICAL MATERIALS, THEIR PRODUCTION AND LIQUID CRYSTAL DISPLAYS AND LED'S MADE BY USING THE MATERIALS

CROSS-REFERENCE TO RELATED APPLICATIONS

This application is a 371 national phase application of PCT/JP01/10802 filed on 10 Dec. 2001, claiming priority to JP 2000-398382, filed on 27 Dec. 2000, JP 2001-37225 filed 14 Feb. 2001, and JP2001-37226 filed 14 Feb. 2001, the contents of which are incorporated herein by reference.

TECHNICAL FIELD

The present invention relates to curable compositions. More particularly, the invention relates to a curing agent, curable compositions or compositions for optical materials, capable of providing for cured artifacts having laudable heat resistance, optical transparency, and light resistance; optical materials and methods for their production; and liquid crystal displays and LED's made by using the materials.

BACKGROUND ART

As optical materials for liquid-crystal displays, among other uses, materials of low birefringence, small coefficient of photoelasticity, and high optical transparency are used. Moreover, in the case of materials for liquid displays, the production process involved makes it mandatory to use highly heat-resisting materials. As the raw materials satisfying these requirements, glass and the like have heretofore been employed.

While optical materials for liquid crystal displays, among other uses, are used in a thin film form or a fine tube or rod form in many instances, the recent market calls for the use of a thinner film form or a finer tube or rod form. However, the conventional material glass is brittle and, hence, the scope of its utility is self-limited under the circumstances.

As tough materials, high polymer materials are available but in the case of thermoplastic resin, for instance, introduction of an aromatic skeleton for expression of high heat resistance generally results in increased birefringence and increased coefficient of photoelasticity, so that it is difficult to reconcile high heat resistance with good optical properties. In the case of thermosetting resin, the thermosetting resins heretofore known are generally colored and, therefore, unsuited for optical use. Moreover, these resins generally have polarity and are unfavorable for expression of optical properties.

There has been proposed a curable composition comprising a compound having a carbon-carbon double bond, a compound containing a SiH group, and a hydrosilylation catalyst (e.g. Japanese Kokai Publication Hei-03-277645, Japanese Kokai Publication Hei-07-3030, Japanese Kokai Publication Hei-09-302095, Japanese Kokai Publication Hei-05-295270, Japanese Kokai Publication Hei-07-62103). The specific compositions thus proposed invariably provide for the satisfactory physical, thermal, and electrical characteristics attributable to the crosslinking reaction between the carbon-carbon double bond and the SiH group. However, since none are satisfactory enough in the aspect of optical transparency, these compositions are not suited for optical use and, hence, limited in industrial value.

A curable composition containing a triallyl isocyanurate as a component has also been proposed (Japanese Kokai Publication Sho-50-100, Japanese Kokai Publication Hei-09-291214). Among the specific compositions proposed, the cured artifact obtainable from the curable composition described in Japanese Kokai Publication Sho-50-100 has only a low glass transition temperature and is inadequate in heat resistance.

SUMMARY OF THE INVENTION

The present invention, therefore, has for its object to provide a curing agent, curable compositions or compositions for optical materials, capable of providing for cured artifacts having laudable heat resistance, optical transparency, and light resistance; optical materials and methods for their production; and liquid crystal displays and LED's made by using the materials.

The present invention, therefore, is concerned with a curing agent (hereinafter referred to sometimes as curing agent (B1)),
which comprises at least two SiH groups in each molecule which is obtainable by subjecting
an aliphatic organic compound (α1) having at least two carbon-carbon double bonds capable of reacting with a SiH group in each molecule, said organic compound containing 1 to 6 vinyl groups in each molecule, and having a molecular weight of less than 900 and a viscosity of less than 1,000 poises and
an acyclic and/or cyclic polyorganosiloxane (β1) having at least two SiH groups in each molecule
to hydrosilylation reaction.

The present invention is further concerned with a curing agent (hereinafter referred to sometimes as curing agent (B2)),
which comprises at least two SiH groups in each molecule which is obtainable by subjecting
an organic compound (α2) represented by the following general formula (I)

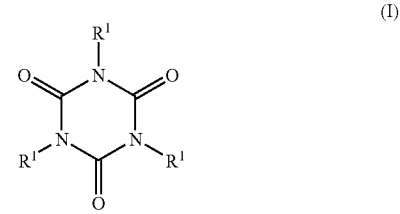

(I)

in the formula, $R^1$ represents a univalent organic group of 1 to 50 carbon atoms and the respective $R^1$s may be different or the same, and
a cyclic polyorganosiloxane (β2) having at least two SiH groups in each molecule
to hydrosilylation reaction.

The present invention is further concerned with a curable composition,
which comprises
an organic compound (A) having at least two carbon-carbon double bonds capable of reacting with a SiH group in each molecule,
said curing agent (B1) and/or curing agent (B2), and a hydrosilylation catalyst (C).

The above component (A) is preferably an organic compound represented by the following general formula (I)

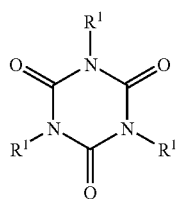

(I)

in the formula, $R^1$ represents a univalent organic group of 1 to 50 carbon atoms and the respective $R^1$s may be different or the same.

More preferably, at least two of the three $R^1$s in the general formula (I) representing the component (A) are groups represented by the following general formula (II)

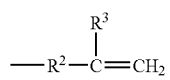

(II)

in the formula, $R^2$ represents a direct bond or a bivalent organic group of 1 to 48 carbon atoms; $R^3$ represents a hydrogen atom or a methyl group; $R^2$ and $R^3$ each in a plurality of occurences may be different or the same.

At least two of the three R's in the general formula (I) representing the above component (A) are preferably allyl groups.

The above component (A) is preferably an organic compound having at least one vinyl group capable of reacting with a SiH group in each molecule.

The above component (A) is preferably an organic compound having at least one allyl group capable of reacting with a SiH group in each molecule.

The above component (A) is preferably an organic compound containing 1 to 6 vinyl groups in each molecule and having a molecular weight of less than 900 and a viscosity of less than 1,000 poises.

The above component (A) is preferably at least one compound selected from the group consisting of polybutadiene, vinylcyclohexene, cyclopentadiene, dicyclopentadiene, divinylbiphenyl, bisphenol A diallyl ether, triallyl isocyanurate, and trivinylcyclohexane.

The present invention is further directed to a composition for optical material,
which comprises said curable composition.

The present invention is further directed to an optical material,
which is obtainable by curing said composition for optical material.

The optical material mentioned above is preferably a film for liquid crystal, a plastic cell for liquid crystal, or a sealant for LED.

The present invention is further directed to a method of producing said optical material,
which comprises mixing said composition for optical material in advance and subjecting carbon-carbon double bonds capable of reacting with a SiH group to a reaction with some or all of SiH groups within the composition.

In a further aspect, the present invention is directed to a liquid crystal display or LED,
which comprises said optical material.

DISCLOSURE OF INVENTION

The present invention is now described in detail.

On Component (α1)

As the component (α1), any aliphatic organic compound containing at least two carbon-carbon double bonds capable of reacting with a SiH group in each molecule and having
1 to 6 vinyl groups in each molecule,
a molecular weight of less than 900, and
a viscosity of less than 1,000 poises can be used without particular restriction.

In view of the balance between reactivity and storage stability, the component (α1) should be a compound having 1 to 6 vinyl groups in each molecule, preferably not less than 2 but not more than 4 vinyl groups. While the vinyl group referred to above is a univalent group represented by $CH_2=CH—$, this vinyl group corresponds to a carbon-carbon double bond capable of reacting with a SiH group in some cases and does not corresponds in other cases.

In view of the ease of handling and the heat resistance and electrical characteristics of the cured artifact, the component (α1) should be a compound having a molecular weight of less than 900, preferably less than 700, more preferably less than 500.

From the standpoint of ease of handling and processability, the viscosity of component (α1) is preferably less than 1,000 poises, more preferably less than 300 poises, still more preferably less than 30 poises. The viscosity of component (α1) as referred to above is a viscosity value at 23° C. and can be measured with an E-type viscometer (produced by Tokyo Instruments Co., for instance). As to the measuring rotor, a 1°34' (48 dia.) rotor can be used. Regarding the rotational speed, a speed selected from among 0.5 rpm, 1 rpm, 2.5 rpm, 5 rpm, 10 rpm, 20 rpm, 50 rpm, and 100 rpm that will give a reading of 10 to 90 can be used.

Referring, further, to said component (α1), when its structure is represented dividedly by the skeletal moiety and the group (alkenyl group) attached to the skeletal moiety by covalent bonding (through a bivalent or polyvalent substituent depending on cases) and having a carbon-carbon double bond capable of reacting with a SiH group, the alkenyl group may be present in any position within the molecule.

The skeleton of the component (α1) which is an organic compound is not particularly restricted provided that it is an aliphatic one and may be whichever of an organic polymer skeleton and an organic monomer skeleton. The term "aliphatic" is used in this specification referring to compounds exclusive of aromatic organic compounds and, therefore, covers alicyclic compounds.

As the organic polymer skeleton, a polyether type, polyester type, polyarylate type, polycarbonate type, saturated hydrocarbon type, polyacrylate ester type, polyamide type, or polyimide type skeleton, for instance, can be used.

The monomer skeleton includes aliphatic hydrocarbon type, alicyclic type, and mixed-type skeletons.

The alkenyl group of component (A) is not particularly restricted provided that it is capable of reacting with an SiH group but from the standpoint of reactivity, alkenyl groups represented by the following general formula (III):

(III)

(wherein $R^4$ represents a hydrogen atom or a methyl group; the respective $R^4$s may be the same or different) are preferred. From the standpoint of starting material availability,

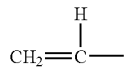

is particularly preferred.

The alkenyl group may be attached to the skeletal moiety of component (A) by a covalent bonding through a bivalent or polyvalent substituent group, and said bivalent or polyvalent substituent group is not particularly restricted provided that it is a substituent of 0 to 10 carbon atom(s). As examples of such substituent,

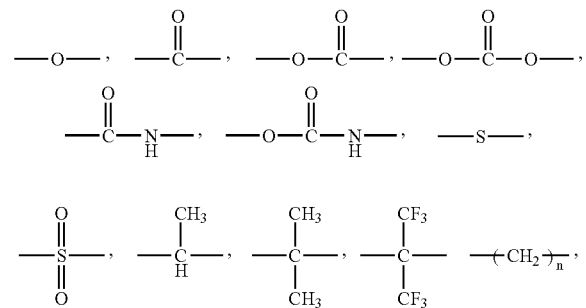

(n denotes a number of 1 to 10),

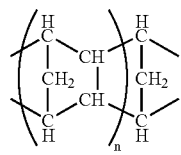

(n denotes a number of 0 to 4)

can be mentioned. It should be understood that two or more of these bivalent or polyvalent substituent groups may be linked by covalent bonding to constitute one bivalent or polyvalent substituent.

As examples of the group which may be attached to the skeletal moiety by covalent bonding, there can be mentioned vinyl, allyl, methallyl, acryl, methacryl, 2-hydroxy-3-(allyloxy)propyl, 2-(allyloxy)ethyl, 2,2-bis(allyloxymethyl)butyl, 3-allyloxy-2,2-bis(allyloxymethyl)propyl,

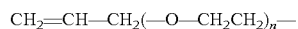

(n denotes a number satisfying the relation $5 \geq n \geq 2$),

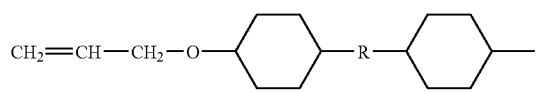

(R represents a bivalent group selected from among

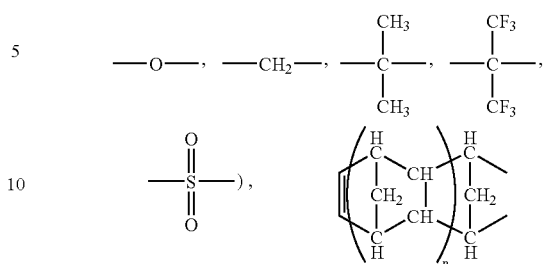

(n denotes a number of 0 to 4), among others.

As component (α1), a low molecular weight compound which cannot be properly represented dividedly by skeletal moiety and alkenyl group as described above can also be used. As examples of such low molecular weight compound, aliphatic acyclic polyene compounds such as butadiene, isoprene, octadiene, decadiene, etc., substituted aliphatic cyclic olefin compounds such as vinylcyclopentene, vinylcyclohexene, etc., and alicyclic compounds such as 1,2,4-trivinylcyclohexane etc. can be mentioned.

Among these examples of component (α1), α,ω-diene compounds such as decadiene are not preferred because the cured artifacts tend to be brittle and poor in dynamic characteristics.

Moreover, it is preferable that the component (α1) does not contain an inner olefin structure. When an inner olefin structure is contained, this inner olefin structure tends to remain unreacted even after the hydrosilylation/curing reaction so that the photodegradation resistance is liable to be decreased. In the present context, the inner olefin structure means a structure such that, in

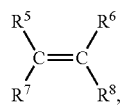

either one or both of $R^5$ and $R^6$ are substituent groups other than hydrogen and either one or both of $R^7$ and $R^8$ are substituent groups other than hydrogen.

For the expression of further enhanced heat resistance, said component (α1) should contain carbon-carbon double bonds capable of reacting with a SiH group in a proportion of not less than 0.001 mol per gram of the component (α1), more preferably not less than 0.005 mol per gram of the component (α1), still more preferably not less than 0.008 mol per gram of the component (α1).

As specific examples, there can be mentioned butadiene, isoprene, vinylcyclohexene, decadiene, diallyl phthalate, trimethylolpropane diallyl ether, and pentaerythritol triallyl ether, oligomers thereof, 1,2-polybutadiene (1,2=10 to 100%, preferably 1,2=50 to 100%),

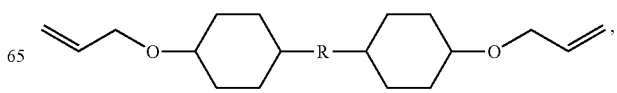

-continued

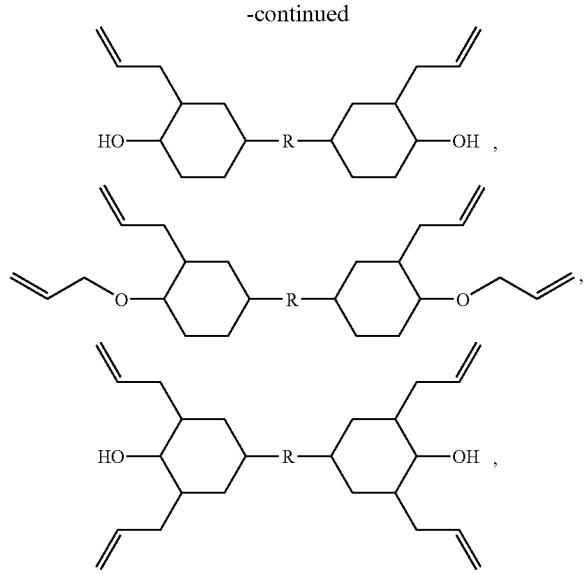

(R represents a bivalent group selected from among

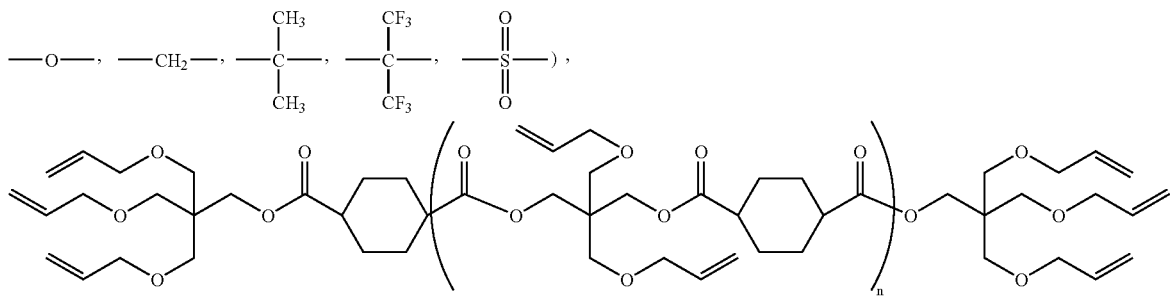

(n≈1), among others.

The number of carbon-carbon double bonds capable of reacting with a SiH group as occurring in component (α1) should be at least 2 per molecule but, for improved heat resistance, is preferably over 2, more preferably not less than 3, particularly preferably not less than 4. If the number of carbon-carbon double bonds capable of reacting with a SiH group as occurring in component (α1) is not more than 1 per molecule, the reaction of the component (α1) with the component (β) gives rise only to a graft structure and does not yield a crosslinked structure.

Moreover, for enhanced reactivity of component (α1) with component (β), at least one of the carbon-carbon double bonds capable of reacting with a SiH group as occurring in the organic compound, i.e. component (α1), is preferably an allyl group. More preferably at least two of said carbon-carbon double bonds are allyl groups.

From commercial availability points of view and in consideration of the reactivity with component (β), heat resistance and transparency, among other characteristics, of the cured artifact, 1,2-polybutadiene, 2,2-bis(4-hydroxycyclohexyl)propane diallyl ether, 4-vinylcyclohexene, cyclopentadiene, and 1,2,4-trivinylcyclohexane can be mentioned as preferred species of component (α1).

On Component (β1)

The component (β1) is now described.

The acyclic and/or cyclic polyorganosiloxane having at least two SiH groups in each molecule, namely the component (β1) according to the invention, is not particularly restricted but from the standpoint of compatibility with component (α1), the preferred are cyclic polyorganosiloxanes having at least two SiH groups in each molecule which may be represented by the following general formula (IV):

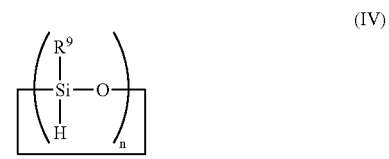

(IV)

(wherein $R^9$ represents an organic group of 1 to 6 carbon atoms; n denotes a number of 3 to 10). Referring to the compound of general formula (IV), the substituent $R^9$ is preferably a group composed of C, H, and O, more preferably a hydrocarbon group. From availability and other points of view, 1,3,5,7-tetramethylcyclotetrasiloxane is particularly preferred.

The above-mentioned species of component (β1) can be used each independently or as a mixture of two or more different species.

On the Reaction Between Component (α1) and Component (β1)

The blending ratio of said components (α1) and components (β1) is not particularly restricted but in consideration of the strength of the cured artifact resulting from the hydrosilylation reaction of the component (B1) and component (A), with the understanding that a higher SiH content of component (B1) generally leads to a greater cured strength, the ratio of the number (X) of carbon-carbon double bonds capable of reacting with a SiH group in said component (α1) and the number (Y) of SiH groups in said component (β1) is preferably $5 \geq Y/X \geq 1$, more preferably $3.5 \geq Y/X \geq 2$.

Now, as the catalyst for use in said hydrosilylation reaction of components (α1) and components (β1), the following catalysts, among others, can be employed. For example, platinum metal, solid platinum supported on a carrier such as alumina, silica or carbon black, chloroplatinic acid, complexes of chloroplatinic acid with alcohols, aldehydes, ketones or the like, platinum-olefin complexes (e.g. $Pt(CH_2\!=\!CH_2)_2(PPh_3)_2$, $Pt(CH_2\!=\!CH_2)_2Cl_2$), platinum-vinylsiloxane complexes (e.g. $Pt(ViMe_2SiOSiMe_2Vi)_n$, $Pt[(MeViSiO)_4]_m$), platinum-phosphine complexes (e.g. $Pt(PPh_3)_4$, $Pt(PBu_3)_4$), platinum-phosphite complexes (e.g. Pt[P(OPh)$_3$]$_4$, Pt[P(OBu)$_3$]$_4$) (wherein Me represents methyl, Bu represents butyl, Vi represents vinyl, Ph represents phenyl, n and m each is an integer), dicarbonyldichloroplatinum, Karstedt catalyst, the platinum-hydrocarbon complexes described in U.S. Pat. Nos. 3,159,601 and 3159662 issued to Ashby, and the platinum alcoholate catalyst described in U.S. Pat. No. 3,220,972 issued to Lamoreaux can be mentioned. Furthermore, the platinum chloride-olefin complex described in U.S. Pat. No. 3,516,946 issued to Modic is also useful for purposes of the present invention.

As catalysts other than platinum compounds, PhCl(PPh)$_3$, RhCl$_3$, RhAl$_2$O$_3$, RuCl$_3$, IrCl$_3$, FeCl$_3$, AlCl$_3$, PdCl$_2$.2H$_2$O, NiCl$_2$, TiCl$_4$, etc. can be mentioned as examples.

Among these, chloroplatinic acid, platinum-olefin complexes, platinum-vinylsiloxane complexes, etc. are preferred from the standpoint of catalyst activity. Moreover, these catalysts may be used each independently or in a combination of two or more species.

The level of addition of the catalyst is not particularly restricted but in order to insure sufficient curability and hold the cost of the curable composition comparatively low, the amount of the catalyst per mole of SiH is preferably within the range of $10^{-1}$ to $10^{-8}$ mole, more preferably $10^{-2}$ to $10^{-6}$ mole.

On the component (α2)

As the component (α2), any organic compound represented by the following general formula (I):

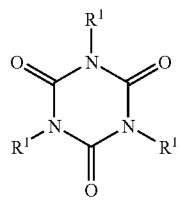

(wherein R$^1$ represents a univalent organic group of 1 to 50 carbon atoms and the plurality of R's may be different or the same) can be used without any particular limitation. This organic compound is preferably a compound having at least 2 carbon-carbon double bonds capable of reacting with a SiH group in each molecule.

From the standpoint of freedom from the problems of gas permeation and cissing, this organic compound is preferably not a compound containing the siloxane unit (Si—O—Si), such as a polysiloxane-organic block copolymer or a polysiloxane-organic graft copolymer, but is a skeleton exclusively comprised of C, H, N, O, S, and halogen as constituent elements.

Referring to R$^1$ in the above general formula (I), from the standpoint of increased heat resistance of the cured artifact obtained, R$^1$ is preferably a univalent organic group of 1 to 20 carbon atoms, more preferably a univalent organic group of 1 to 10 carbon atoms, still more preferably a univalent organic group of 1 to 4 carbon atoms. Thus, the preferred group for R$^1$ includes methyl, ethyl, propyl, butyl, phenyl, benzyl, phenethyl, vinyl, allyl, glycidyl, —(CH$_2$)$_n$CH$_3$ (wherein n denotes a number of 4 to 19), —(CH$_2$)$_n$CH═CH$_2$ (wherein n denotes a number of 2 to 18),

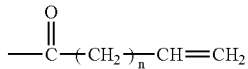

(wherein n denotes a number of 0 to 17),

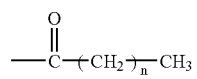

(wherein n denotes a number of 0 to 19),

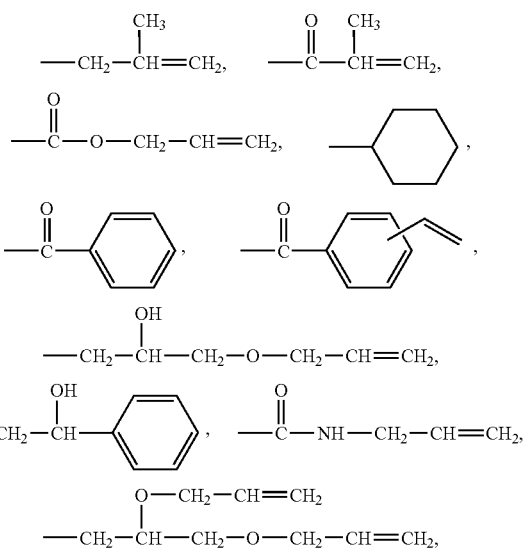

among others.

Referring, further, to R$^1$ in the above general formula (I), from the standpoint of improved adhesion of the cured artifact obtained to various kinds of materials, at least one of the three R$^1$s is preferably a univalent organic group containing 1 to 50 carbon atoms and having at least one epoxy group, more preferably a univalent organic group containing 1 to 50 carbon atoms and having at least one epoxy group of the formula:

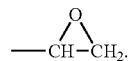

As examples of the preferred R$^1$, there can be mentioned glycidyl,

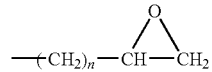

(wherein n denotes a number of 2 to 18),

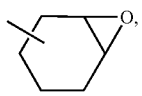

among others.

From the standpoint of improved chemical stability against heat of the cured artifact obtained, $R^1$ in the above general formula (I) is preferably a univalent $C_{1-50}$ organic group containing not more than 2 oxygen atoms and exclusively comprised of C, H, and O as constituent atoms, more preferably a univalent $C_{1-50}$ hydrocarbon group. As examples of the preferred group for the above $R^1$, there can be mentioned methyl, ethyl, propyl, butyl, phenyl, benzyl, phenethyl, vinyl, allyl, glycidyl, $-(CH_2)_n CH_3$ (wherein n denotes a number of 4 to 49), $-(CH_2)_n CH=CH_2$ (wherein n denotes a number of 2 to 48),

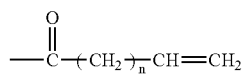

(wherein n denotes a number of 0 to 47),

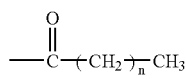

(wherein n denotes a number of 0 to 49),

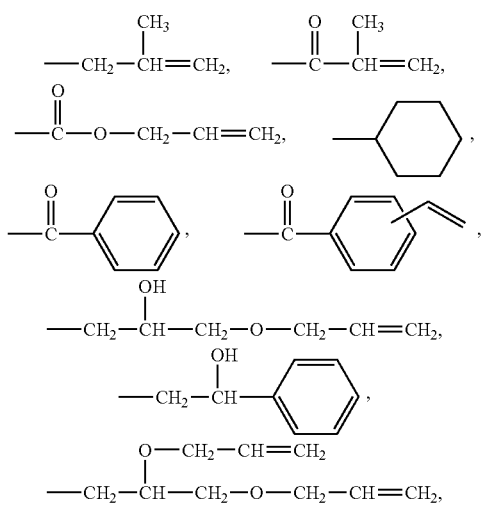

among others.

Referring, further, to $R^1$ in the above general formula (I), from the standpoint of improved reactivity, at least one of the three $R^1$s is preferably a univalent $C_{1-50}$ organic group containing at least one group of the formula:

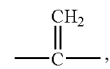

more preferably a univalent $C_{1-50}$ organic group containing at least one group of the formula:

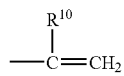

(wherein $R^{10}$ represents a hydrogen atom or a methyl group).

Further more preferably, at least two of the three $R^1$s in the above general formula (I) are each a group represented by the following general formula (II):

(II)

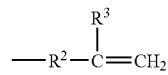

(wherein $R^2$ represents a direct bond or a bivalent organic group of 1 to 48 carbon atoms; $R^3$ represents a hydrogen atom or a methyl group; $R^2$ and $R^3$ each in a plurality of occurrences may be the same or different).

While $R^2$ in the above general formula (II) is a direct bond or a bivalent organic group of 1 to 48 carbon atoms, from the standpoint of improved heat resistance of the cured artifact obtained, it is preferably a direct bond or a bivalent organic group of 1 to 20 carbon atoms, more preferably a direct bond or a bivalent organic group of 1 to 10 carbon atoms, still more preferably a direct bond or a bivalent organic group of 1 to 4 carbon atoms. As examples of such preferred group for $R^2$, there can be mentioned $-(CH_2)_n-$ (wherein n denotes a number of 1 to 17),

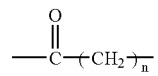

(wherein n denotes a number of 0 to 16),

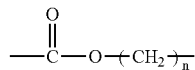

(wherein n denotes a number of 0 to 16),

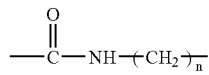

(wherein n denotes a number of 0 to 16),

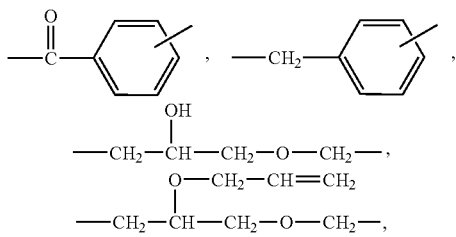

among others.

Referring, further, to $R^2$ in the above general formula (II), from the standpoint of improved chemical resistance to heat of the cured artifact obtained, $R^2$ is preferably a direct bond or a bivalent $C_{1-48}$ organic group containing not more than 2 oxygen atoms and exclusively comprised of C, H, and O as constituent elements, more preferably a direct bond or a bivalent $C_{1-48}$ hydrocarbon group. As examples of such preferred group for $R^2$, there can be mentioned —(CH$_2$)$_n$— (wherein n denotes a number of 1 to 47),

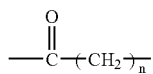

(wherein n denotes a number of 0 to 46),

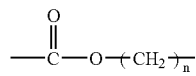

(wherein n denotes a number of 0 to 46),

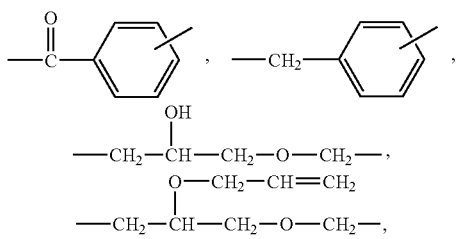

among others.

$R^3$ in the above general formula (II) represents a hydrogen atom or a methyl group but from the standpoint of improved reactivity, a hydrogen atom is preferred.

However, even with regard to the above preferred examples of the organic compound represented by the general formula (I), it is essentially necessary that each compound has at least two carbon-carbon double bonds capable of reacting with a SiH group in each molecule. From the standpoint of improved heat resistance, more preferably said organic compound has at least 3 carbon-carbon double bonds capable of reacting with a SiH group in each molecule.

The organic compound represented by the above general formula (I) is preferably a compound having fluidity at a temperature not over 100° C. in order that it may be uniformly miscible with the other components and for satisfactory workability. Although there is practically no limitation on molecular weight, a compound within the range of 50 to 100,000 can be used with advantage. If the molecular weight exceeds 100,000, the material will generally have high viscosity to interfere with workability and, in addition, the effect of crosslinking due to the reaction between the carbon-carbon double bond and the SiH group will not be easily expressed.

The preferred species of the above organic compound represented by the general formula (I) includes triallyl isocyanurate,

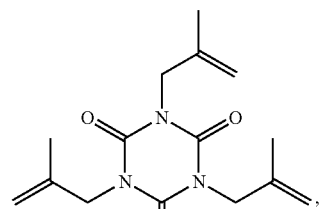

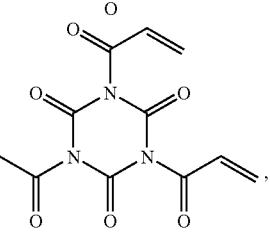

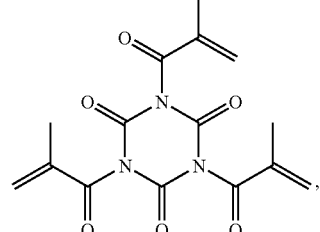

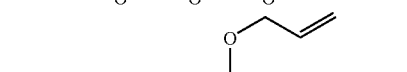

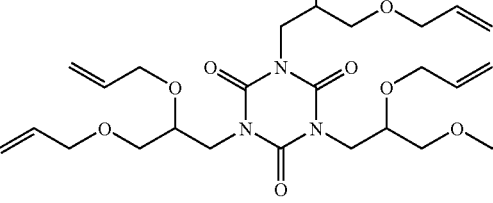

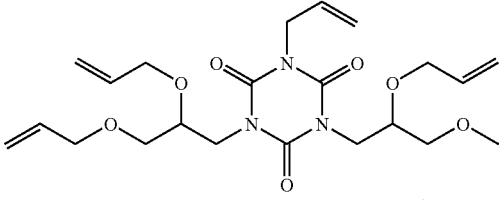

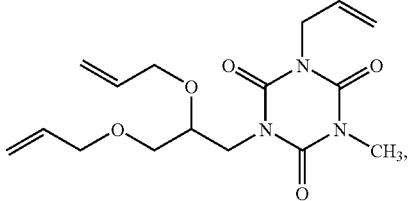

-continued

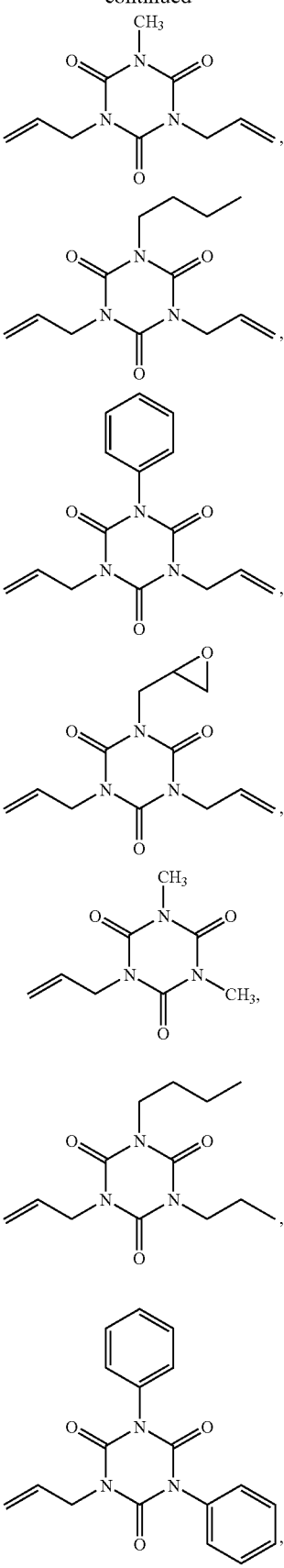

-continued

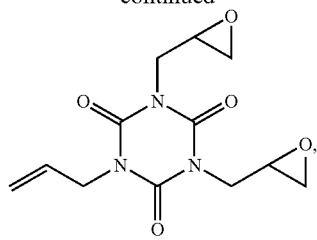

among others.

These organic compounds represented by the general formula (I) can be used each independently or as a mixture of two or more species.

On the component (β2)

The component (β2) is now described.

The cyclic polyorganosiloxane having at least two SiH groups in each molecule as the component (β2) according to the invention is not particularly restricted but from the standpoint of good compatibility with the component (α2), the cyclic polyorganosiloxane having at least two SiH groups in each molecule as represented by the following general formula (IV):

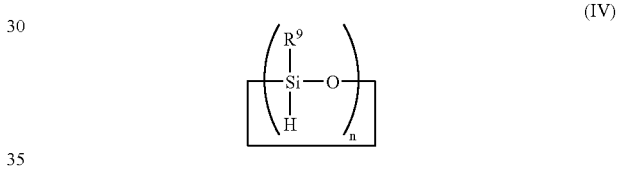

(IV)

(wherein $R^9$ represents an organic group of 1 to 6 carbon atoms; n denotes a number of 3 to 10) is preferred. The substituent group $R^9$ in the compound represented by the general formula (IV) is preferably a compound comprised of C, H, and O, more preferably a hydrocarbon group. From availability points of view, 1,3,5,7-tetramethylcyclotetrasiloxane is particularly preferred.

These various species of component (β2) can be used each independently or as a mixture of 2 or more different species.

On the Reaction Between Component (α2) and Component (β2)

The mixing ratio of said component (α2) and component (β2) is not particularly restricted but in consideration of the strength of the cured artifact obtainable by the hydrosilylation of the resulting component (B2) and said component (A), with the understanding that the higher the SiH content of component (B2) is, the greater is the cured strength, generally the ratio of the number (X) of carbon-carbon double bonds capable of reacting with a SiH group in said component (α2) and the number (Y) of SiH groups in said component (β2) is preferably $5 \geq Y/X \geq 1$, more preferably $3.5 \geq Y/X \geq 2$.

Now, as the catalyst for use in the hydrosilylation reaction of components (α2) and components (β2), the following catalysts, among others, can be employed. For example, platinum metal, solid platinum supported on a carrier such as alumina, silica or carbon black, chloroplatinic acid, complexes of chloroplatinic acid with alcohols, aldehydes or ketones, platinum-olefin complexes (e.g. $Pt(CH_2=CH_2)_2(PPh_3)_2$, $Pt(CH_2=CH_2)_2Cl_2$), platinum-vinylsiloxane complexes (e.g. $Pt(ViMe_2SiOSiMe_2Vi)_n$, $Pt[(MeViSiO)_4]_m$), platinum-phosphine complexes (e.g. Pt(PPh$_3$)$_4$, Pt(PBu$_3$)$_4$), platinum-phosphite complexes (e.g. Pt[P(OPh)$_3$]$_4$, Pt[P(OBu)$_3$]$_4$) (wherein Me represents methyl, Bu represents butyl, Vi represents vinyl, Ph represents phenyl, n and m each is an integer), dicarbonyldichloroplatinum, Karstedt catalyst, the platinum-hydrocarbon complexes described in U.S. Pat. Nos. 3,159,601 and 3,159,662 issued to Ashby, and the platinum alcoholate catalyst described in U.S. Pat. No. 3,220,972 issued to Lamoreaux can be mentioned. Furthermore, the platinum chloride-olefin complex described in U.S. Pat. No. 3,516,946 issued to Modic is also useful for purposes of the present invention.

As catalysts other than platinum compounds, PhCl(PPh)$_3$, RhCl$_3$, RhAl$_2$O$_3$, RuCl$_3$, IrCl$_3$, FeCl$_3$, AlCl$_3$, PdCl$_2$.2H$_2$O, NiCl$_2$, TiCl$_4$, etc. can be mentioned as examples.

Among these, chloroplatinic acid, platinum-olefin complexes, and platinum-vinylsiloxane complexes are preferred from the standpoint of catalyst activity. Moreover, these catalysts may be used each independently or in a combination of two or more species.

The level of addition of the catalyst is not particularly restricted but in order to insure sufficient curability and hold the cost of the curable composition comparatively low, the amount of the catalyst per mole of SiH is preferably within the range of $10^{-1}$ to $10^{-8}$ mole, more preferably $10^{-2}$ to $10^{-6}$ mole.

On the Component (A) in the Curable Composition

The component (A) according to the invention is now described.

The component (A) is an organic compound comprising an organic skeleton having at least two carbon-carbon double bonds capable of reacting with a SiH group in each molecule. The organic skeleton is preferably a skeleton not containing a siloxane unit (Si—O—Si), such as a polysiloxane-organic block copolymer or a polysiloxane-organic graft copolymer, but is a skeleton exclusively comprised of C, H, N, O, S, and halogen as constituent elements. When a siloxane unit is contained, such problems as gas permeation and cissing are encountered.

Referring to the component (A), when its structure is represented dividedly by the skeletal moiety and the group (alkenyl) attached to said skeletal moiety by covalent bonding (through a bivalent or polyvalent substituent group depending on cases) and having a carbon-carbon double bond capable of reacting with a SiH group, the alkenyl group(s) may be present in any position within the molecule.

The skeleton of the component (A) as an organic compound is not particularly restricted but may be whichever of an organic polymer skeleton and an organic monomer skeleton.

The organic polymer skeleton includes polyether type, polyester type, polyarylate type, polycarbonate type, saturated hydrocarbon type, polyacrylate ester type, polyamide type, phenol-formaldehyde type (phenolic resin type), and polyimide type skeletons.

The organic monomer skeleton includes aromatic hydrocarbon type skeletons, such as phenol, bisphenol, benzene, and naphthalene skeletons, aliphatic hydrocarbon type skeletons, and mixtures thereof.

The alkenyl groups of the component (A) are not particularly restricted provided that each is reactive with a SiH group but from the standpoint of reactivity, alkenyl groups represented by the following general formula (III):

(III)

(wherein $R^4$ represents a hydrogen atom or a methyl group; $R^4$ in a plurality of occurrences may be the same or different) are suitable. From the standpoint of starting material availability, the group

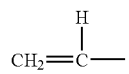

is particularly preferred.

Referring, further, to the alkenyl groups of the component (A), alkenyl groups represented by the following general formula (V):

(V)

(wherein $R^{11}$ represents a hydrogen atom or a methyl group) are advantageous in that the heat resistance of the cured artifact is high. Moreover, from the standpoint of starting material availability, the group

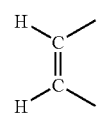

is particularly preferred.

The alkenyl group may be attached to the skeletal moiety of component (A) by covalent bonding through a bivalent or polyvalent substituent group, and while this bivalent or polyvalent substituent group is not particularly restricted provided that it is a substituent group containing 0 to 10 carbon atoms, it is preferably a group exclusively comprising C, H, N, O, S, and halogen as constituent elements. As examples of such substituent group, there can be mentioned

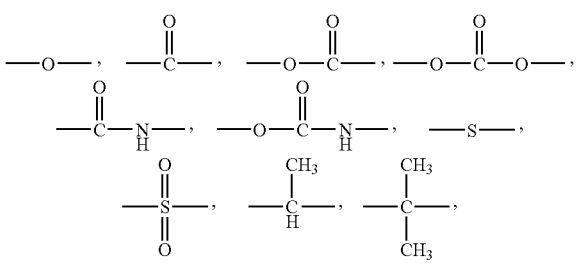

-continued

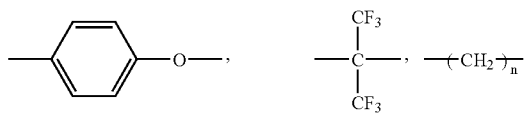

(n denotes a number of 1 to 10),

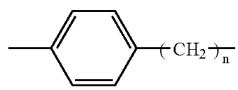

(n denotes a number of 0 to 4),

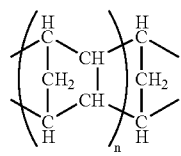

(n denotes a number of 0 to 4)

Two or more of these bivalent or polyvalent substituent groups may be linked to each other by covalent bonding to constitute a single bivalent or polyvalent substituent group.

As examples of the group capable of being attached to the skeletal moiety by covalent bonding, there can be mentioned vinyl, allyl, methallyl, acryl, methacryl, 2-hydroxy-3-(allyloxy)propyl, 2-allylphenyl, 3-allylphenyl, 4-allylphenyl, 2-(allyloxy)phenyl, 3-(allyloxy)phenyl, 4-(allyloxy)phenyl, 2-(allyloxy)ethyl, 2,2-bis(allyloxymethyl)butyl, 3-allyloxy-2,2-bis(allyloxymethyl)propyl,

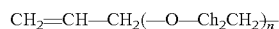

(n denotes a number satisfying the relation 5≧n≧2),

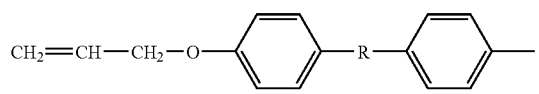

(R represents a bivalent group selected from among

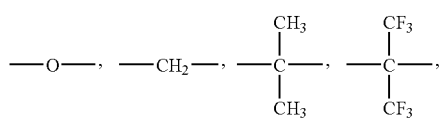

-continued

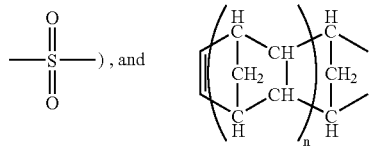

(n denotes a number of 0 to 4).

As component (A), a low molecular weight compound, which cannot be properly represented dividedly by skeletal moiety and alkenyl group as described above, can also be used. The low molecular weight compound mentioned just above includes aliphatic acyclic polyene compounds such as butadiene, isoprene, octadiene, decadiene, etc., aliphatic cyclic polyene compounds such as cyclopentadiene, cyclooctadiene, dicyclopentadiene, tricyclopentadiene, norbornadiene, triallyl isocyanurate, trivinylcyclohexane, etc., and substituted aliphatic cycloolefin compounds such as vinylcyclopentene, vinylcyclohexene, and so forth.

From the standpoint of enhanced heat resistance, said component (A) should contain carbon-carbon double bonds capable of reacting with a SiH group in a proportion of not less than 0.001 mole, more preferably not less than 0.005 mole, particularly preferably not less than 0.008 mole, per gram of component (A).

As specific examples, there can be mentioned butadiene, isoprene, vinylcyclohexene, cyclopentadiene, dicyclopentadiene, cyclohexadiene, decadiene, diallyl phthalate, trimethylolpropane diallyl ether, pentaerythritol triallyl ether, divinylbenzene (of 50 to 100% purity, preferably 80 to 100% purity), 1,3-diisopropenylbenzene, and 1,4-diisopropenylbenzene, oligomers thereof, 1,2-polybutadiene (1,2=10 to 100%, preferably 1,2=50 to 100%), triallyl isocyanurate, trivinylcyclohexane,

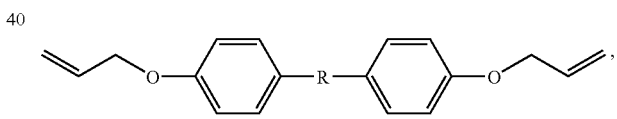

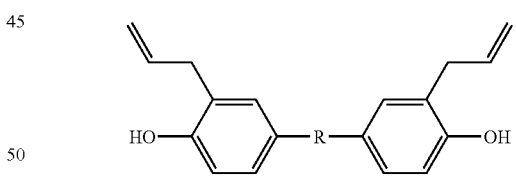

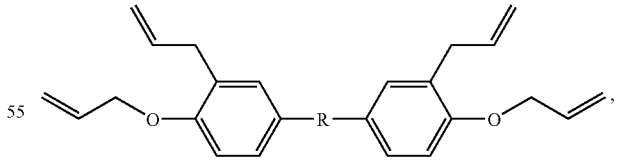

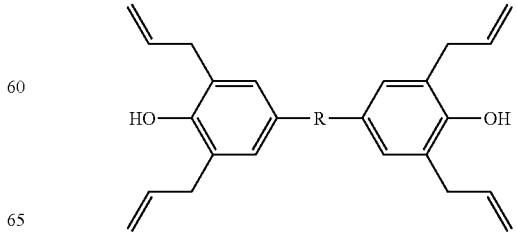

(R represents a bivalent group selected from among

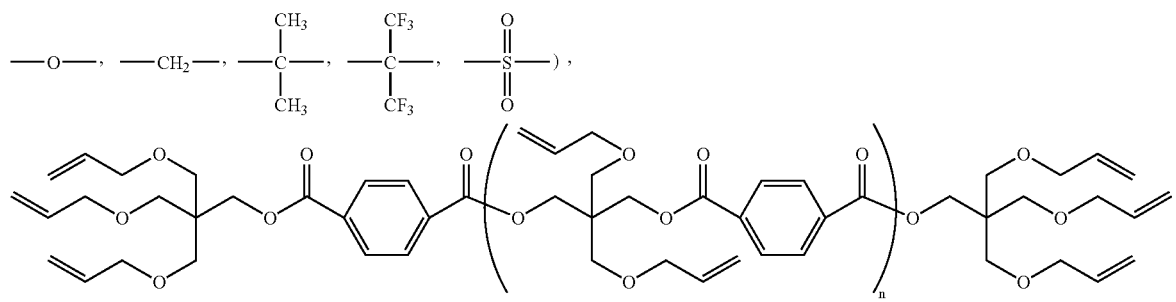

$(n≈1)$, among others.

Referring, further, to component (A), from the standpoint of favorable optical properties such as low birefringence and low coefficient of photoelasticity, the percentage by weight of the aromatic ring in component (A) is preferably not more than 50 weight %, more preferably not more than 40 weight %, still more preferably not more than 30 weight %. Most preferably the component (A) does not contain an aromatic ring.

From the standpoint of minimal coloration and high optical transparency, and high resistance to coloration by light of the cured artifact, the preferred component (A) is vinylcyclohexene, dicyclopentadiene, triallyl isocyanurate, or trivinylcyclohexane, and among these, triallyl isocyanurate or trivinylcyclohexane is still more preferred.

The number of carbon-carbon double bonds capable of reacting with a SiH group in the component (A) need be at least 2 per molecule but from the standpoint of attaining a further improvement in heat resistance, is preferably over 2, more preferably not less than 3, particularly preferably not less than 4. If the number of carbon-carbon double bonds capable of reacting with a SiH group in the component (A) is not more than 1 in each molecule, the reaction with component (B) gives rise only to a graft structure and does not yield a crosslinked structure.

For attaining uniform blending with the other components and good workability, the component (A) is preferably a compound which is fluid at temperatures not over 100° C. It may be whichever of a linear compound and a branched compound and although its molecular weight is not particularly restricted, a compound having a molecular weight within the range of 50 to 100,000 can be used with advantage. If the molecular weight exceeds 100,000, generally the material gains in viscosity too much to insure workability and, at the same time, the crosslinking effect due to the reaction between alkenyl and SiH is hardly expressed.

Furthermore, in order that the reactivity with component (B) will be increased, the component (A) is preferably an organic compound comprising an organic skeleton having at least one vinyl group capable of reacting with SiH within the molecule, more preferably an organic compound comprising an organic skeleton having at least two vinyl groups within the molecule.

Additionally, in order that the reactivity with component (B) will be increased, the component (A) is preferably an organic compound comprising an organic skeleton having at least one allyl group capable of reacting with SiH within the molecule, more preferably an organic compound comprising an organic skeleton having at least two allyl groups within the molecule.

As the component (A) preferred from the standpoint of commercial availability, there can be mentioned polybutadiene, vinylcyclohexene, cyclopentadiene, dicyclopentadiene, divinylbiphenyl, triallyl isocyanurate, trivinylcyclohexane, and bisphenol A diallyl ether.

The preferred component (A) is an organic compound containing at least two carbon-carbon double bonds capable of reacting with a SiH group in each molecule, which can be represented by the following general formula (I):

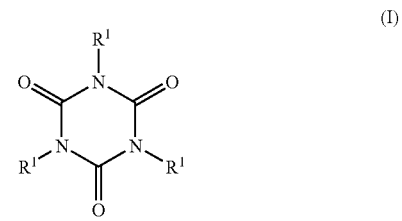

(I)

(wherein $R^1$ represents a univalent organic group of 1 to 50 carbon atoms and the plurality of $R^1$s may be the same or different).

From the standpoint of freedom from gas permeation and cissing, it is preferable that the above organic compound does not contain a siloxane unit (Si—O—Si) as it is true of polysiloxane-organic block copolymer and polysiloxane-organic graft copolymer but comprises a skeleton exclusively composed of C, H, N, O, S, and halogen as constituent elements.

From the standpoint of still higher heat resistance of the cured artifact obtained, $R^1$ in the above general formula (I) is preferably a univalent organic group of 1 to 20 carbon atoms, more preferably a univalent organic group of 1 to 10 carbon atoms, still more preferably a univalent organic group of 1 to 4 carbon atoms. The preferred species of $R^1$ includes methyl, ethyl, propyl, butyl, phenyl, benzyl, phenethyl, vinyl, allyl, glycidyl, —(CH$_2$)$_n$CH$_3$ (wherein n denotes a number of 4 to 19), —(CH$_2$)$_n$CH=CH$_2$ (wherein n denotes a number of 2 to 18),

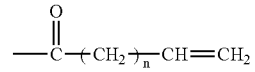

(wherein n denotes a number of 0 to 17),

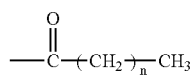

(wherein n denotes a number of 0 to 19),

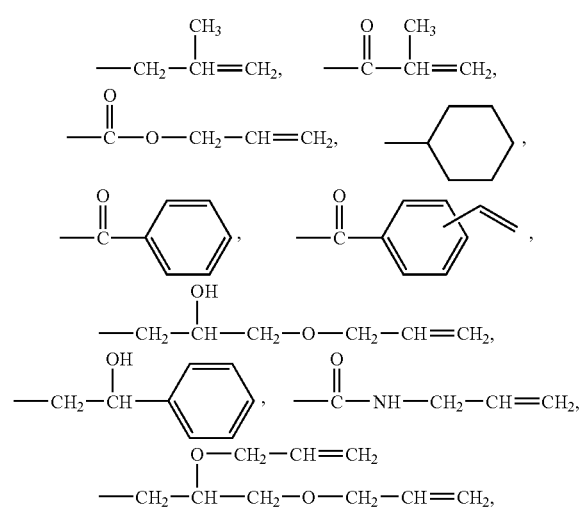

among others.

From the standpoint of improved adhesion of the cured artifact obtained to various kinds of materials, at least one of the three $R^1$s in the above general formula (I) is preferably a univalent organic group containing 1 to 50 carbon atoms and having at least one epoxy group, more preferably a univalent organic group containing 1 to 50 carbon atoms and having at least one epoxy group represented by the formula

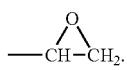

As preferred examples of $R^1$, there can be mentioned glycidyl,

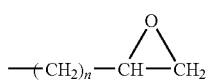

(wherein n denotes a number of 2 to 18),

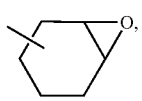

among others.

Referring, further, to the above general formula (I), from the standpoint of chemical stability against heat of the cured artifact obtained, $R^1$ is preferably a univalent organic group containing 1 to 50 carbon atoms and not more than two oxygen atoms and exclusively composed of C, H, and O as constituent elements, more preferably a univalent hydrocarbon group of 1 to 50 carbon atoms. As preferred specific examples of $R^1$, there can be mentioned methyl, ethyl, propyl, butyl, phenyl, benzyl, phenethyl, vinyl, allyl, glycidyl, —$(CH_2)_n$—$CH_3$ (wherein n denotes a number of 4 to 49), —$(CH_2)_n$—$CH=CH_2$ (wherein n denotes a number of 2 to 48),

(wherein n denotes a number of 0 to 47),

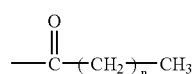

(wherein n denotes a number of 0 to 49),

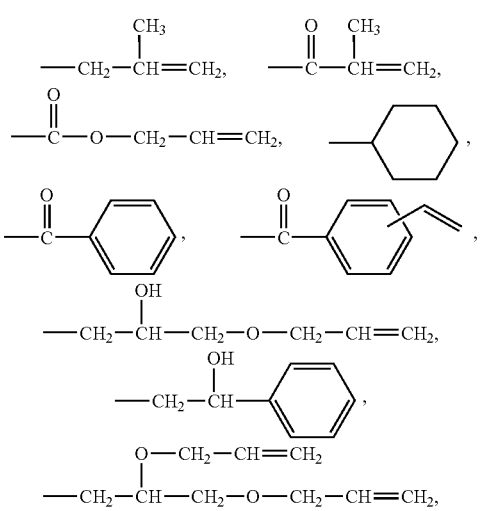

among others.

From the standpoint of improved reactivity, at least one of the three $R^1$s in the above general formula (I) is a univalent organic group containing 1 to 50 carbon atoms and having at least one group represented by the formula

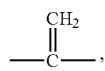

more preferably a univalent organic group containing 1 to 50 carbon atoms and having at least one group represented by the formula

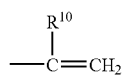

(wherein $R^{10}$ represents a hydrogen atom or a methyl group).

Still more preferred is the case in which at least two of the three $R^1$s in the above general formula (I) are groups represented by the following general formula (II):

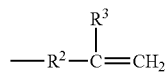
(II)

(wherein $R^2$ represents a direct bond or a bivalent organic group of 1 to 48 carbon atoms; $R^3$ represents a hydrogen atom or a methyl group; $R^2$ and $R^3$ each in a plurality of occurrences may be the same or different).

While $R^2$ in the above general formula (II) represents a direct bond or a bivalent organic group of 1 to 48 carbon atoms as defined above, it is preferably either a direct bond or a bivalent organic group of 1 to 20 carbon atoms, more preferably a direct bond or a bivalent organic group of 1 to 10 carbon atoms, still more preferably a direct bond or a bivalent organic group of 1 to 4 carbon atoms, in view of the still greater heat resistance that can be attained in the cured artifact obtained. As preferred examples of $R^2$, there can be mentioned —$(CH_2)_n$— (wherein n denotes a number of 1 to 17),

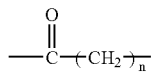

(wherein n denotes a number of 0 to 16),

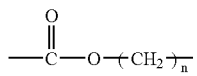

(wherein n denotes a number of 0 to 16),

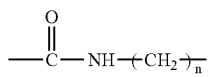

(wherein n denotes a number of 0 to 16),

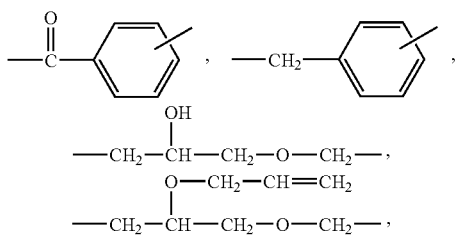

among others.

From the standpoint of improved chemical stability against heat of the cured artifact obtained, $R^2$ in the above general formula (II) is preferably a direct bond or a bivalent $C_{1-48}$ organic group containing two oxygen atoms at a maximum and exclusively composed of C, H, and O as constituent elements, more preferably a direct bond or a bivalent hydrocarbon group of 1 to 48 carbon atoms. As preferred examples of $R^2$, there can be mentioned —$(CH_2)_n$— (wherein n denotes a number of 1 to 47),

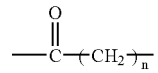

(wherein n denotes a number of 0 to 46),

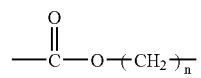

(wherein n denotes a number of 0 to 46),

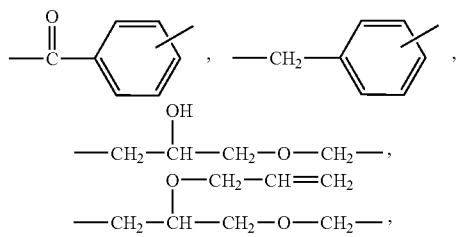

among others.

While $R^3$ in the above general formula (II) is a hydrogen atom or a methyl group, a hydrogen atom is preferred from the standpoint of improved reactivity.

Even those preferred examples of the organic compound represented by the general formula (I) should essentially contain at least two carbon-carbon double bonds capable of reacting with a SiH group within each molecule. From the standpoint of improved heat resistance, the organic compound is more preferably a compound having 3 or more carbon-carbon double bonds capable of reacting with a SiH group within the molecule.

The component (A) is preferably an organic compound containing 1 to 6 vinyl groups in each molecule and having a molecular weight of less than 900 and a viscosity of less than 1,000 poises.

From the standpoint of balance between reactivity and storage stability, the component (A) is preferably selected from among compounds containing 1 to 6 vinyl groups within the molecule, more preferably a compound containing 2 or more vinyl groups or a compound containing a maximum of 4 vinyl groups. Incidentally, said vinyl group is a univalent group represented by the formula $CH_2=CH$— and this vinyl group may or may not correspond to said carbon-carbon double bond capable of reacting with SiH depending on cases.

From the standpoint of the ease of handling and the heat resistance and electrical characteristics of the cured artifact, the molecular weight of component (A) is preferably less than 900, more preferably less than 700, still more preferably less than 500.

From the standpoint of ease of handling and processability, the viscosity of component (A) is preferably less than 1,000 poises, more preferably less than 300 poises, still more preferably less than 30 poises. The viscosity of component (A) as referred to above is a viscosity value at 23° C. and can be measured with an E-type viscometer (produced by Tokyo Instruments Co., for instance). As to the measuring rotor, a 1°34' (48 dia.) rotor can be used. Regarding the rotational speed, a speed selected from among 0.5 rpm, 1 rpm, 2.5 rpm, 5 rpm, 10 rpm, 20 rpm, 50 rpm, and 100 rpm that will give a reading of 10 to 90 can be used.

To insure uniform blending with the other components and good workability, the organic compound represented by the above general formula (I) is preferably a compound which is fluid at temperatures not over 100° C. The molecular weight is not particularly restricted but the range of 50 to 100,000 is advantageous. If the molecular weight exceeds 100,000, the material generally becomes too viscous to insure good workability and, at the same time, the crosslinking effect due to the reaction between carbon-carbon double bond and SiH group tends to be hardly expressed.

As preferred examples of the organic compound represented by the general formula (I), there can be mentioned triallyl isocyanurate,

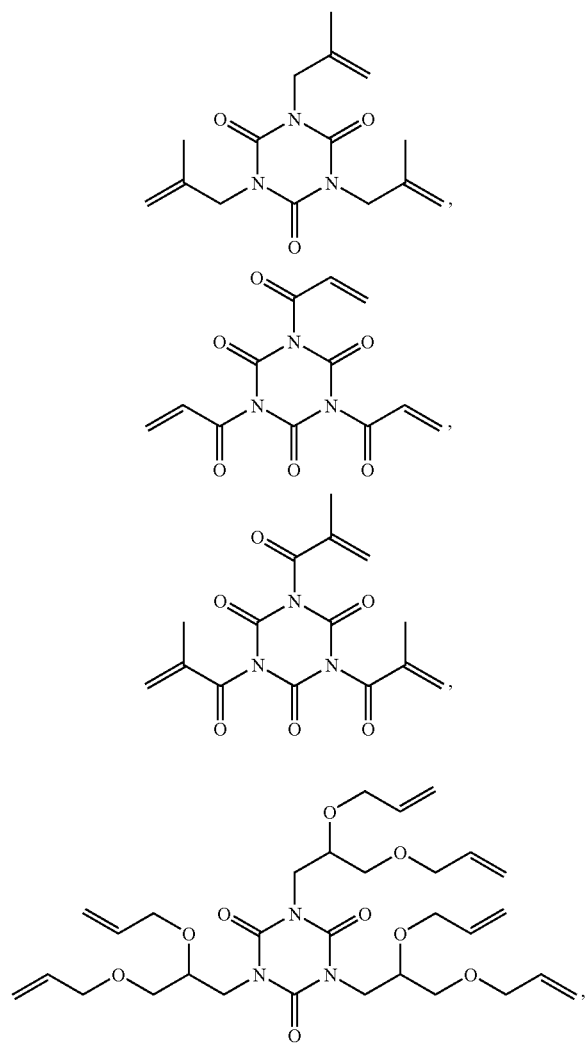

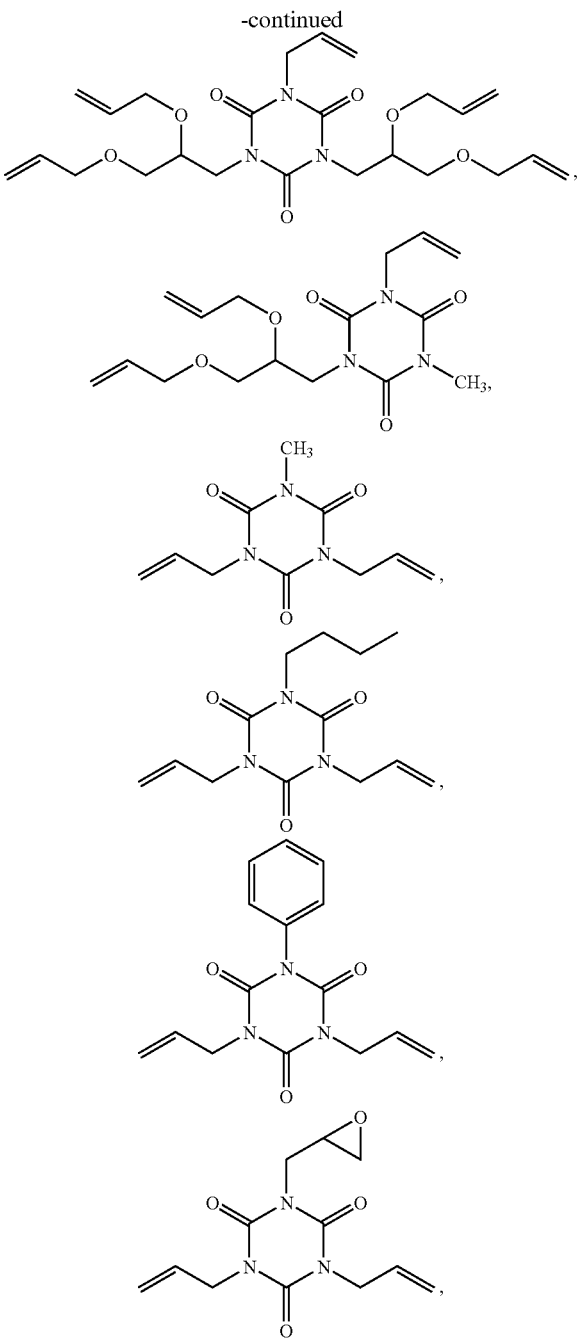

among others.

These organic compounds of general formula (I) can be used each independently or as a mixture of two or more different species.

Triallyl isocyanurate as an example of component (A) can be produced by various alternative methods. For example, the methods described in Japanese Kokai Publication 2000-109314, Japanese Kokai Publication 2000-119016, Japanese Kokai Publication Hei-11-255753, Japanese Kokai Publication Hei-09-208564, Japanese Kokai Publication Hei-08-259711, Japanese Kokai Publication Hei-04-321655, Japanese Kokai Publication Hei-04-49284, Japanese Kokai Publication Sho-62-48671, Japanese Kokai Publication Sho- 62-45578, Japanese Kokai Publication Sho-58-85874, Japanese Kokai Publication Sho-57-200371, Japanese Kokai Publication Sho-54-130591, Japanese Kokai Publication Sho-53-92791, Japanese Kokai Publication Sho-50-95289, Japanese Kokai Publication Sho-48-26022, Japanese Kokai Publication Sho-47-22588, Japanese Kokai Publication Sho-47-14395, Japanese Kokai Publication Sho-43-29395, Japanese Kokai Publication Sho-45-15981, Japanese Kokai Publication Sho-43-29146, U.S. Pat. No. 3,376,301, U.S. Pat. No. 3,322,761, SUP1121260, SUP1121259, SUP765265, DEP2126296, and Bull. Chem. Soc. Jpn. 39(9), p. 1922, 1966, among others, can be employed.

Triallyl isocyanurate as an example of component (A) may be purified where necessary. The purification technology includes vacuum distillation, washing with acidic water, alkaline water, and/or neutral water, an adsorption treatment using an adsorbent such as silica gel, activated carbon, aluminum silicate or the like, a treatment with a desiccant such as molecular sieves, for instance, and dehydration with azeotropy with toluene, among others.

The blending ratio of said component (A) and component (B) is not particularly restricted provided that the necessary strength may be sustained but the ratio of the number (X) of carbon-carbon double bonds capable of reacting with a SiH group in said component (A) and the number (Y) of SiH groups in said component (B) is preferably $2 \geqq Y/X \geqq 0.5$. In the case of $Y/X>2$ or $0.5>Y/X$, no sufficient curability may be expressed so that sufficient strength and heat resistance may not be obtained.

On the Component (C) in the Curable Composition

The hydrosilylation catalyst (C) that can be used includes the following catalysts, among others: platinum metal, solid platinum supported on a carrier such as alumina, silica or carbon black, chloroplatinic acid, complexes of chloroplatinic acid with alcohols, aldehydes, or ketones, platinum-olefin complexes (e.g. $Pt(CH_2=CH_2)_2(PPh_3)_2$, $Pt(CH_2=CH_2)_2Cl_2$), platinum-vinylsiloxane complexes (e.g. $Pt(ViMe_2SiOSiMe_2Vi)_n$, $Pt[(MeViSiO)_4]_m$), platinum-phosphine complexes (e.g. $Pt(PPh_3)_4$, $Pt(PBu_3)_4$), platinum-phosphite complexes (e.g. $Pt[P(OPh)_3]_4$, $Pt[P(OBu)_3]_4$) (where Me stands for methyl, Bu for butyl, Vi for vinyl, Ph for phenyl; n and m each denotes an integer), dicarbonyldichloroplatinum, Karstedt catalyst, the platinum-hydrocarbon complexes described in U.S. Pat. Nos. 3,159,601 and 3,159,662 issued to Ashby, and the platinum alcoholate catalysts described in U.S. Pat. No. 3,220,972 issued to Lamoreaux, among others. Furthermore, the platinum chloride-olefin complexes described in U.S. Pat. No. 3,516,946 issued to Modic are also useful for purposes of the invention.

As catalysts other than platinum compounds, $RhCl(PPh_3)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, and $TiCl_4$ can be mentioned by way of example.

Among these, from the standpoint of catalyst activity, chloroplatinic acid, platinum-olefin complexes, and platinum-vinylsiloxane complexes can be used with advantage. These catalysts may be used each independently or in a combination of two or more species.

The level of addition of component (C) is not particularly restricted but in order that sufficient curability may be attained and the cost of the curable composition may be held comparatively low, the amount of component (C) per mole of SiH is preferably within the range of $10^{-1}$ to $10^{-8}$ mole, more preferably within the range of $10^{-2}$ to $10^{-6}$ mole.

Additives for the Curable Composition

For the purpose of improving the storage stability of the composition of the invention or adjusting the reaction rate of the hydrosilylation reaction in the production stage, a cure retardant can be employed. The cure retardant includes compounds containing aliphatic unsaturated bonds, organophosphorus compounds, organosulfur compounds, nitrogen-containing compounds, tin compounds, and organic peroxides, among others, and these may be used in combination. As the compounds containing aliphatic unsaturated bonds, there can be mentioned propargyl alcohol compounds, ene-yne compounds, and maleic esters, among others. The organophosphorus compounds referred to above include triorganophosphines, diorganophosphines, organophosphones, triorganophosphites, and so forth. The organosulfur compounds include organomercaptans, diorganosulfides, hydrogen sulfide, benzothiazole, and benzothiazole disulfide, among others. The nitrogen-containing compounds include ammonia, primary to tertiary alkylamines, arylamines, urea, and hydrazine, among others. The tin compounds include stannous halide dihydrates, stannous carboxylates, etc. The organic peroxide includes di-t-butyl peroxide, dicumyl peroxide, benzoyl peroxide, t-butyl perbenzoate, and so forth.

Among these cure retardants, benzothiazole, thiazole, dimethyl malate, 3-hydroxy-3-methyl-1-butyne are preferred from the standpoint of good retardant activity and starting material availability.

The level of addition of the cure retardant is preferably $10^{-1}$ to $10^3$ moles, more preferably 1 to 50 moles, per mole of the hydrosilylation catalyst to be used.

Where necessary, the composition of the invention may be supplemented with an inorganic filler. Addition of an inorganic filler contributes to the prevention of flow of the composition and the strengthening of the material. The inorganic filler is preferably a fine-grain variety that does not detract from optical characteristics, such as alumina, aluminum hydroxide, fused silica, crystalline silica, fine-grain amorphous silica powder, hydrophobic fine-grain silica powder, talc, and barium sulfate, among others.

The technology of adding a filler includes the method which comprises adding a hydrolyzable silane monomer or oligomer, such as an alkoxysilane, acyloxysilane, silane halide or the like, or a metal alkoxide, acyloxide or halide, e.g. that of titanium or aluminum, to the composition of the invention and causing it to react in the composition or in a partially reacted phase of the composition to thereby allow the inorganic filler to form in the composition.

For the purpose of improving the performance characteristics of the composition of the invention, various thermosetting resins can be added. The thermosetting resins include but are not limited to epoxy resin, cyanate resins, phenolic resins, polyimide resins, and urethane resins. Among these, transparent epoxy resins are preferred in view of high clarity and practically useful properties such as high adhesiveness.

The transparent epoxy resins include such epoxy resins as bisphenol A diglycidyl ether, 2,2'-bis(4-glycidyloxycyclohexyl)propane, 3,4-epoxycyclohexylmethyl-3,4-epoxycyclohexanecarboxylate, vinylcyclohexene dioxide, 2-(3,4-epoxycyclohexyl)-5,5-spiro-(3,4-epoxycyclohexane)-1,3-dioxane, bis(3,4-epoxycyclohexyl) adipate, 1,2-cyclopropanedicarboxylic acid bisglycidyl ester, triglycidyl isocyanurate, monoallyldiglycidyl isocyanurate, diallylmonoglycidyl isocyanurate, etc. which are cured by an aliphatic acid anhydride such as hexahydrophthalic anhydride, methylhexahydrophthalic anhydride, trialkyltetrahydrophthalic anhydride, hydrogenated methyl nadic anhydride or the like. These epoxy resins or curing agents can be used each independently or a plurality thereof may be used in combination.

Furthermore, the composition of the invention may be supplemented with various additives intended to improve light emitting diode characteristics. As such additives, there may be mentioned fluorescent materials such as a cerium-activated yttrium-aluminum-garnet series fluorescent material which absorbs light from a light emitting device to produce a long-wavelength fluorescent emission, a coloring matter such as a blueing agent which absorbs the light of a specified wavelength, various inorganic or organic diffusers which diffuse light, such as titanium dioxide, aluminum oxide, silica, silicon oxide such as quartz glass, talc, calcium carbonate, melamine resin, CTU guanamine resin, benzoguanamine resin, etc., heat-conductive fillers, e.g. glass, metal oxides such as aluminosilicates, and metal nitrides such as aluminum nitride, boron nitride, and so forth.

Furthermore, for the purpose of improving the characteristics of the composition of the invention, various resins can also be added. Such resins include but are not limited to polycarbonate resins, polyethersulfone resins, polyarylate resins, epoxy resins, cyanate resins, phenolic resins, acrylic resins, polyimide resins, poly(vinylacetal) resins, urethane resins, and polyester resins.

The composition of the invention can be directly formed into a film or the like but may also be supplied as a varnish by dissolving it in an organic solvent. The solvent which can be used is not particularly restricted but includes hydrocarbon solvents such as benzene, toluene, hexane, heptane, etc., ether solvents such as tetrahydrofuran, 1,4-dioxane, diethyl ether, etc., ketone solvents such as acetone, methyl ethyl ketone, etc., and halogenated hydrocarbon solvents such as chloroform, methylene chloride, 1,2-dichloroethane, etc., to mention a few preferred examples. As the solvent, two or more different solvent species can be used in admixture. The preferred solvent species are toluene, tetrahydrofuran, and chloroform. The level of use of the solvent per gram of component (A) is preferably 0 to 10 mL, more preferably 0.5 to 5 mL, particularly preferably 1 to 3 mL. If the amount of the solvent is too small, the effect of use of a solvent, such as viscosity reduction, may not be sufficiently expressed. If the amount is too large, the solvent tends to remain in the material to cause troubles such as thermal cracking as well as cost disadvantage, thus detracting from the commercial utility of the material.

The composition of the invention may be supplemented with a coupling agent. The coupling agent includes a silane coupling agent, for instance. The silane coupling agent is not particularly restricted provided that it is a compound having at least one functional group reactive with an organic group and at least one hydrolyzable silicon-containing group within the molecule. The group reactive with an organic group is preferably at least one group selected from among epoxy, methacryl, acryl, isocyanate, isocyanurate, vinyl, and carbamate from the standpoint of the ease of handling. From the standpoint of curability and adhesion, epoxy, methacryl and acryl are particularly preferred. As the hydrolyzable silicon-containing group, alkoxysilyl groups are advantageous in terms of the ease of handling and methoxysilyl and ethoxysilyl are particularly preferred from reactivity points of view.

The preferred silane coupling agent includes epoxy function-containing alkoxysilanes such as 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, etc.; and methacryl or acryl function-containing alkoxysilanes such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, acryloxymethyltriethoxysilane, and so forth.

The level of addition of the silane coupling agent relative to 100 weight parts of [component (A)+component (B)] is preferably 0.1 to 50 weight parts, more preferably 0.5 to 25 weight parts. If it is less than 0.1 weight part, the expected adhesion-improving effect will not be expressed. If it exceeds 50 weight parts, the physical properties of the cured artifact will be adversely affected.

For an enhanced effect of said coupling agent, a silanol condensation catalyst can be further employed, and with such a catalyst, enhancement and/or stabilization of adhesion can be realized. The silanol condensation catalyst is not particularly restricted but is preferably an aluminum compound and/or a titanium compound. The aluminum compound which may serve as a silanol condensation catalyst includes aluminum alkoxides such as aluminum triisopropoxide, sec-butoxyaluminum diisopropoxide, aluminum tri-sec-butoxide, etc.; and aluminum chelate compounds such as ethyl acetoacetate aluminum diisopropoxide, aluminum tris(ethyl acetoacetate), Alumichelate M (product of Kawaken Fine Chemicals Co., alkyl acetoacetate aluminum diisopropoxide), aluminum tris(acetylacetonate), aluminum monoacetylacetonate bis (ethyl acetoacetate), etc., and from the standpoint of the ease of handling, aluminum chelates are used with greater advantage. The titanium compound which may serve as a silanol condensation catalyst includes tetraalkoxytitaniums such as tetraisopropoxytitanium, tetrabutoxytitanium, etc.; titanium chelate compounds such as titanium tetraacetylacetonate etc.; and the common titanate coupling agents having oxyacetic acid or ethylene glycol as a residue. These silanol condensation catalysts can be used each independently or in a combination of two or more species. The level of use of the silanol condensation catalyst, when used, is preferably 0.1 to 30 weight parts, more preferably 1 to 15 weight parts, based on 100 weight parts of the silane coupling agent. If the level of use of the silanol condensation catalyst is too low, the expected effect of addition of the silanol condensation catalyst will not be expressed. If it is too high, local exotherm and foaming take place in curing, leading to a failure to obtain a satisfactory cured artifact.

The composition of the invention may be further supplemented, within the range not frustrating the intention and effect of the invention, with an aging inhibitor, radical inhibitor, ultraviolet absorber, adhesion improving agent, fire retardant additive, surfactant, storage stability improving agent, ozone degradation inhibitor, light stabilizer, viscosity builder, plasticizer, antioxidant, thermal stabilizer, electrical conductivity-imparting agent, antistatic agent, radiation shielding agent, nucleating agent, phosphorus series peroxide decomposer, lubricant, pigment, metal ion deactivator, physical property controlling agent, and other additives.

Physical Properties of the Curable Composition

While the composition of the invention can be provided in the various formulations described above, the composition preferred from the standpoint of heat resistance is the composition which gives a cured artifact showing a glass transition point (Tg) not below 50° C., more preferably not below 100° C., particularly preferably not below 120° C.

Optical Materials

The term "optical material" in the context of the present invention means the material in general which is used in applications involving the transmission of light, such as visible light, infrared rays, ultraviolet rays, X-rays, laser beams, etc. through it.

As a more specific example, a sealant for the light emitting diode (LED) can be mentioned.

Furthermore, in the field of liquid crystal display, the liquid crystal display peripheral materials such as substrate materials, light guide plate, prism sheet, polarizer, optical retardation sheet, viewing angle calibration film, adhesive, polarizer protective film and other films for liquid crystal can also be mentioned. In addition, the sealant, anti-reflection film, optical calibration film, housing material, front glass protective film, substitute material for front glass, and adhesive for use in the color PDP (plasma display) which is expected to be a flat panel display of the next generation; the LED device molding material, sealant for LED, front glass protective film, substitute material for front glass, and adhesive for LED display; the substrate material, light guide plate, prism sheet, polarizer, optical retardation sheet, viewing angle calibration film, adhesive, and polarizer protective film for plasma address liquid crystal (PALC) display; front glass protective film, substitute material for front glass, and adhesive for organic EL (electroluminescence) display; and various film substrates, front glass protective film, substitute material for front glass, and adhesive for field emission display (FED).

Uses in the field of optical recording are VD (video disk), CD/CD-ROM, CD-R/RW, DVD-R/DVD-RAM, MO/MD, PD (phase change optical disk), disk substrate for optical cards, pickup lens, protective film, sealant, adhesive, and so forth.

Uses in the field of optical instruments include not only the lens material, finder prism, target prism, finder cover, and light-receiving sensor for still cameras but also the photographic lens and finder for video cameras. The projection lens, protective film, sealant, adhesive, etc. for projection television use and the lens material, sealant, adhesive, film, etc. for photosensing instrumentation are also included.

In the field of optical components, uses include fiber materials, lens, wave guide, device sealant, adhesive, etc. for the peripherals of optical switches for optical communications systems; optical fiber materials, ferrule, sealant, adhesive, etc. for the peripherals of light connectors; lens, wave guide, LED device sealant, adhesive, etc. among light-driven parts and optical circuit components; and substrate materials, fiber materials, device sealant, and adhesive for the peripherals of optoelectronic integrated circuits (OEIC).

In the field of optical fiber, the illumination and light guide, etc. for decorative display; industrial sensors; display, labels, etc.; and optical fibers for the communications infrastructure and household digital appliances are reckoned as typical uses.

As the peripheral materials for semiconductor integrated circuits, microlithographic resist materials for LSI and super-LSI materials can be reckoned as uses.

In the field of road vehicles and transport machines, automotive lamp reflectors, bearing retainers, gear parts, anticorrosive coatings, switch parts, headlamps, engine internal parts, electrical instrumentation parts, various interior and exterior mountings, driving engines, brake oil tank, automotive rustproof steel sheets, interior panels, upholstery, protective/bundling wireness, fuel hose, car lamps, glass substitutes, etc. can be reckoned. Furthermore, laminate glass for rolling stock use and the tenacity-imparting material for structural members, engine peripherals, protective/bundling wireness, and anticorrosive coatings, for aircraft can be mentioned.

In the architectural field, interior/processing materials, electrical covers and sheets, interlayers for laminate glass, glass substitute, and solar cell peripheral materials can be reckoned. In the agricultural field, the house cover film can be mentioned. As regards optical/electronic functional organic materials of the next generation, organic EL device peripheral materials, organic photorefractive devices, light-light conversion devices such as photoamplifying devices, photocalculation devices, organic solar cell peripheral substrates, fiber materials, device sealants and adhesives, among others, can be mentioned.

Method of Curing the Compositions for Optical Materials

The compositions for optical materials of the present invention can be cured into an optical material by blending its components in advance and causing the carbon-carbon double bonds capable of reacting with SiH in the composition with some or all of the SiH groups available in the composition.

Various modes of blending can be employed but preferably a mixture of component (A) and component (C) is blended with component (B). The reaction control is difficult when a mixture of component (A) and component (B) is blended with component (C). In the mode of blending a mixture of component (B) and component (C) with component (A), degradation during storage tends to take place because the component (B) in the presence of component (C) is reactive with water.

In reacting the composition to cure, the necessary amounts of respective components (A), (B) and (C) may be blended to react all at once but the method in which parts of them are reacted in the first place and the balances are then added for further reaction or the method which comprises blending the components and causing only a part of the functionality in the composition to react (B-staging) by controlling the reaction conditions or utilizing the difference in reactivity of substituent groups, molding the composition and finally curing it. In these methods, the viscosity adjustment in molding is facilitated.

Regarding the curing technology, the reaction may be effected by mere blending or under heating. The method of carrying out the reaction under heating is preferred in that the reaction rate is high and generally a material of improved heat resistance can be obtained.

The reaction temperature can be set liberally and may for example be 30 to 300° C., more preferably 100 to 250° C., still more preferably 150 to 200° C. If the reaction temperature is too low, the reaction time required to carry the reaction to a sufficient extent is prolonged. If the reaction temperature is increased excessively, molding processability tends to deteriorate.

The reaction may be carried through at a constant temperature but may optionally be carried out in multiple temperature steps or at continuously varying temperature.

The reaction time can also be set liberally.

The reaction pressure may also be set liberally as necessary; thus the reaction can be conducted optionally at atmospheric pressure, high pressure, or low pressure.

The cured optical material may assume a variety of shapes and is not particularly restricted but may be provided in such forms as film, sheet, tube, rod, coating film, and bulk.

The molding technology which can be used includes a variety of methods inclusive of the conventional methods of molding thermosetting resins. Thus, for example, casting, press-forming, mold-casting, transfer molding, coating, RIM, and other methods can be utilized. As the casting mold, ground glass, hard stainless polished plate, polycarbonate sheet, poly(ethylene terephthalate) sheet, and poly(methyl methacrylate) sheet, among others, can be used. For improved releasing-ability, poly(ethylene terephthalate) film, polycarbonate film, poly(vinyl chloride) film, polyethylene film, polytetrafluoroethylene film, polypropylene film, polyimide film, or the like can be utilized.

In molding, various treatments can be applied where necessary. For inhibition of void formation in molding, the composition either as it is or as partially reacted may be subjected to defoaming by centrifugation, pressure reduction, or the like, or the press-forming pressure may be relieved during the process, for instance.

Method for Manufacturing a Liquid Crystal Display

Liquid crystal displays can be fabricated using the optical material of the invention.

In such applications, the optical material of the invention may be used in the form of a film for liquid crystal, e.g. the plastic cell for liquid crystal, polarizer, optical retardation sheet, polarizer-protective film, etc., and the liquid crystal display can be produced in otherwise the same manner as the conventional technology.

Detailed Description on the Use of a Transparent Electrically Conductive Film as an Optical Material The transparent electrically conductive film according to the invention is a film comprising a transparent film formed from a curable composition essentially containing said components (A) to (C) with a transparent electrically conductive layer disposed on at least one side thereof, and is not particularly restricted in any of thickness, appearance, shape and so on.

The transparent electrically conductive layer in the context of the invention is a transparent electrically conductive film, obtainable by covering at least one side of a transparent film with a thin metallic film, a thin semiconductor film, or a multi-layer thin film. It may for example be formed on the whole surface, on one side, or otherwise.

The thin metallic film includes thin films of various metals such as nickel, titanium, chromium, silver, zinc, aluminum, copper, gold, and palladium. The semiconductor film includes thin films of metal oxides, such as films of indium oxide, cadmium oxide, and tin oxide doped with tin, tellurium, cadmium, molybdenum, tungsten, fluorine or the like and films of aluminum-doped zinc oxide, titanium oxide, etc. Particularly the semiconductor film of indium oxide containing 2 to 15 weight % of tin oxide (ITO) is excellent in transparency and electrical conductivity and, hence, may be used with advantage. The multi-layer thin film, namely a film of dielectric material/metal/dielectric material structure, may for example be a titanium oxide/gold/titanium oxide film.

The thickness of the transparent electrically conductive layer is preferably 5 to 200 nm. If the thickness is less than 5 nm, a uniform film may not be easily formed. If it is more than 200 nm, transparency tends to be sacrificed and flexural and bending endurance may also deteriorate.

The technology of forming such a transparent electrically conductive layer includes vacuum vapor deposition, sputtering, ion plating, and ion beam sputtering, among other techniques.

The transparent film as the substrate for said transparent electrically conductive layer may be produced by a variety of alternative methods inclusive of the conventional methods of molding thermosetting resins.

The material which may be used for the mold includes polished glass, rigid stainless polished plate, polycarbonate sheet, poly(ethylene terephthalate) sheet, and poly(methyl methacrylate) sheet, among others. Furthermore, for improved releasing ability, a poly(ethylene terephthalate) film, polycarbonate film, poly(vinyl chloride) film, polyethylene film, polytetrafluoroethylene film, polypropylene film, polyimide film, or the like may be applied.

The transparent electrically conductive film according to the invention may have a functional thin coat tailored to exhibit gas barrier properties, scratch resistance, and chemical resistance.

Thus, various thermoplastic resins, thermosetting resins having amino, imino, epoxy, silyl, or other functional groups, radiation-curable resins having acryloyl, methacryloyl, vinyl, or other groups, or compositions comprising a mixture of such resins and various additives such as a polymerization inhibitor, wax, dispersant, pigment, solvent, dye, plasticizer, UV absorber, and/or inorganic filler can be applied by a suitable coating method such as gravure roll coating, Myer bar coating, reverse roll coating, dip coating, air knife coating, calendar coating, squeeze coating, kiss coating, fountain coating, spray coating or spin coating. Furthermore, after application, radiation-curing or thermally curing may be carried out to provide a cured thin layer. Moreover, when printing is to be made, any of the gravure, offset, flexo, silk screen and other printing systems may be employed. For the purpose of imparting gas seal properties or the like, there may be provided a metal oxide layer whose main component(s) is (are) aluminum, silicon, magnesium, zinc or the like, and such a metal oxide layer may be formed by vacuum vapor deposition, sputtering, ion plating or plasma CVD.

Laminating with other films is also feasible. The laminating may be made by any known technique. Thus, thermal bonding such as heat sealing, impulse sealing, ultrasonic bonding and high frequency bonding, laminating such as extrusion laminating, hot melt laminating, dry laminating, wet laminating, solventless adhesive laminating, thermal laminating and co-extrusion laminating may be utilized. The film for laminating includes polyester resin film, poly(vinyl alcohol) resin film, cellulosic resin film, poly(vinyl fluoride) resin film, poly(vinylidene chloride) resin film, polyacrylonitrile resin film, nylon resin film, polyethylene resin film, polypropylene resin film, acetate resin film, polyimide resin film, polycarbonate film, and polyacrylate film, among others.

As applications of the transparent film according to the invention, there may be mentioned the following uses.

For display uses: membrane switch, liquid crystal display (optical retardation film, polarizer film, plastic liquid crystal cell), electroluminescence, electrochromics, electrophoresis display, plasma display panel, field emission display, diffusion film for backlight, color filter.

For recording uses: electrostatic recording substrate, OHP, mother print, slide film, microfilm, X-ray film.

For photo/magnetic memory uses: thermoplastic recording, ferromagnetic memory, magnetic tape, ID card, bar code.

For antistatic uses: meter window, TV cathode-ray tube, cleanroom window, semiconductor packaging material, VTR tape, dustproofing film for photomasking.

For electromagnetic shielding uses: measuring instruments, medical devices, radiation detector, IC components, CRT, liquid crystal display.

For photoelectric conversion uses: solar cell window, photoamplifier, photosensor.

For thermal ray-reflection uses: window (building, automobile, etc.), incandescent lamp, cooking oven window, furnace porthole, selective-permeable membrane.

For plate heater uses: defroster, aircraft, automobiles, freezer, incubator, goggles, medical devices, liquid crystal display.

For electronic part/circuit material uses: condenser, resistor, thin-film composite circuit, leadless LSI chip carrier mounting.

For electrode uses: electrode for paper battery.

For light-transmissive filter uses: ultraviolet cut filter, ultraviolet transmissive filter, ultraviolet-transmissive/visible light-absorption filter, wavelength-selective filter, light balance filter, neutral density filter, contrast filter, wavelength calibration filter, interference filter, infrared transmissive filter, infrared cut filter, thermal ray-absorption filter, thermal ray-reflection filter.

For selective gas-permeable membrane uses: oxygen/nitrogen separation membrane, carbon dioxide separation membrane, hydrogen separation membrane.

For electrical insulation uses: insulating self-adhesive tape, slot liner for motors, interphase insulation of transformer.

For polymer sensor uses: light sensor, infrared ray sensor, sound wave sensor, pressure sensor.

For surface protecting uses: liquid crystal display, CRT, furniture, system kitchen, car interior and exterior.

Other uses: electrothermal transcription, printer ribbon, electric cable shield, water leak-proofing film.

Method for Production of LED

The optical material of the invention may be used in the production of LED's. Thus, a light emitting diode may be produced by coating a light emitting device with the curable composition described hereinabove.

The light emitting device which may be used as above is not particularly restricted but includes the light emitting devices for the conventional light emitting diodes. Thus, the light emitting device includes the device constructed by stacking a semiconductor material on a substrate optionally provided with a buffer layer, e.g. a GaN, AlN or the like layer, by such a technique as MOCVD, HDVPE or liquid phase epitaxy. As the substrate mentioned above, any of various materials such as sapphire, spinel, SiC, Si, ZnO, GaN single crystal may be employed. Among these, sapphire may be used with advantage because a GaN layer of good crystallinity can be easily formed and a high commercial merit can be enjoyed.

The semiconductor material to be stacked up includes GaAs, GaP, GaAlAs, GaAsP, AlGaInP, GaN, InN, AlN, InGaN, InGaAlN, SiC, and so forth. Among these, from the standpoint of high luminance that can be attained, nitride series compound semiconductors (In$_x$ Ga$_y$ Al$_z$ N) are preferred. Such materials may optionally contain an activator or the like.

The light emitting device structure includes homo junction, hetero junction and double-hetero junction structures having MIS, pn, and/or PIN junction. Moreover, a simplex or a multiplex quantum well structure may be utilized.

The light emitting device may or may not have a passivation layer.

The light emitting device can be formed with electrodes by the conventional technique.

The electrodes on the light emitting device may be electrically connected to lead terminals or the like in various manners. The electrical connector material is preferably a material having good ohmic mechanical compatibility with the electrodes on the light emitting device and includes a bonding wire of gold, silver, copper, platinum, or aluminum, or an alloy thereof. A conductive adhesive comprising an electrically conductive filler such as silver, carbon, or the like loaded with a resin may also be employed. From the standpoint of good workability, an aluminum wire or a gold wire is preferably used.

While the light emitting device may be obtained as above, the luminous intensity of the light emitting device for the light emitting diode of the invention may be optionally selected provided that the luminous intensity in the vertical direction is not less than 1 cd. However, the effect of the invention is remarkable when a light emitting device whose luminous intensity in the vertical direction is not less than 2 cd, and is still more remarkable when a light emitting device over 3 cd is employed.

The emission output of the light emitting device is not particularly restricted and may be liberally selected. But the effect of the invention is remarkable when a light emitting device with an output of not less than 1 mW at 20 mA is employed. The effect is more remarkable when a light emitting device with an output of not less than 4 mW at 20 mA is used, and is still more pronounced when a light emitting device with an output of not less than 5 mW at 20 mA is employed.

The emission wavelength of the light emitting device may range from the ultraviolet region to the infrared region but the effect of the invention is particularly notable when a device with a main peak wavelength of not more than 550 nm is employed.

The light emitting device may be of one kind so as to obtain a monochromatic emission but a plurality of devices may be used for a monochromatic or a multicolor emission.

As the lead terminal for use with the light emitting diode of the invention, the one which is satisfactory not only in the adhesion to the electrical connecting part, such as bonding wire, but also in electrical conductivity is preferred. The electric resistance of the lead terminal is preferably not more than 300 μΩ·cm, more preferably not more than 3 μΩ·cm. The material for the lead terminal may for example be iron, copper, iron-containing copper or tin-containing copper, or any of the corresponding metals plated with silver or nickel. For insuring a satisfactory spread of light, the gloss of such lead terminals may be judiciously adjusted.

While the light emitting diode of the invention may be produced by coating the above-described light emitting device with the curable composition described hereinbefore, the term "coating" in this context means not only coating for direct sealing of the light emitting device but also indirect coating. Thus, the light emitting device may be sealed directly with the curable composition of the invention by any of various known techniques or first sealed with the conventional sealant resin, for example epoxy resin, silicone resin, acrylic resin, urea resin, or imide resin, or glass and, then, coated with the curable composition of the invention in superimposition or in the manner of otherwise enclosing the sealed device. As a further alternative, the light emitting device may be first sealed with the curable composition of the invention and, then, molded with the conventional epoxy resin, silicone resin, urea resin, imide resin or the like. By the above method, the lens effect and other effects may be caused to be expressed according to the differences in refractive index and specific gravity.

In the above case, an additive for improving the light emitting diode characteristics may be incorporated in the composition of the invention, and this additive for improving light emitting diode characteristics may be uniformly incorporated or incorporated with a gradient. Such a filler-containing resin part may be formed by pouring a resin to be used for a molding part of emission plane anterior segment into a mold and, then, casting a filler-containing resin into the mold to form an emission plane posterior segment. Furthermore, the filler-containing resin part may be formed by covering the lead terminal after formation of the molded part with a tape stuck on each of the face and reverse sides, dipping the entirety of the lead frame, i.e. the lower half of the molded part of the light emitting diode, in a reservoir tank containing the filler-containing resin, withdrawing it, and drying the same.

The sealing technology that may be used includes various methods. For example, the curable composition in a liquid form may be poured in a cup, cavity or package concave with the light emitting device disposed in its bottom by means of a dispenser or the like and cured in situ by heating, or the curable composition in a solid or highly viscous fluid form is caused to flow, for example by heating, dispensed into a package concave or the like in the same manner as above, and cured in situ, for example by heating. The package for use may be fabricated using various materials, such as polycarbonate resin, poly(phenylene sulfide) resin, epoxy resin, acrylic resin, silicone resin, ABS resin, poly(butylene terephthalate) resin, and polyphthalamide resin, among others. It is also possible to employ the method which comprises pouring the curable composition in a molding frame in advance, immersing a lead frame or the like to which the light emitting device is secured in the cast composition, and curing the composition. It is also possible to use the method which comprises dispensing the composition by a dispenser into a frame supporting the light emitting device therein or carrying out transfer molding or injection molding to form a sealing layer of the curable composition and curing the composition. As a further alternative, the curable composition in a liquid form or a fluidized state may be simply dripped or coated on the light emitting device and cured. A further alternative method comprises forming a layer of curable resin on the light emitting device by screen process printing or screen printing or coating through a mask and curing the resin. A further alternative method comprises affixing the curable composition, which is partially or completely cured into a planar or lenticular form in advance, on the light emitting device. Furthermore, the composition may be used as a die-bonding agent for securing the light emitting device to a lead terminal or package or may be used as a passivation film on the light emitting device. It may also be used as a package substrate.

The covered part is not particularly restricted in shape but may assume a variety of shapes. For example, a lenticular form, a planar form, a thin film form, or the form described in Japanese Kokai Publication Hei-06-244458. These shapes may be materialized by proper molding and curing of the curable composition or by post-processing after cure of the curable composition.

The light emitting diode of the invention may be provided in various types, for example any of the lamp type, SMD type, and chip type. As the package substrate for SMD type or chip type, various materials may be used, including but not limited to epoxy resin, BT resin, and ceramics.

In addition, the various hitherto-known systems may be applied to the light emitting diode of the invention. There may be mentioned the system providing the back face of the light emitting device with a light-reflecting or -condensing layer, the system providing the bottom with a complementary color segment that compensates for yellowing of the sealant resin, the system providing the light emitting device with a thin film for absorbing light in the shorter wavelength region than the main emission peak, the system in which the light emitting device is first sealed with a soft or liquid sealant and, then, enveloped by molding with a rigid material, the system in which the light emitting device is first sealed with a material which absorbs light from the light emitting device and produces a fluorescent emission of longer wavelength, and, then, enveloped by molding, the system in which a fluorescent substance-containing material is molded in advance and, then, molded together with the light emitting device, the system in which the efficiency of light emission is increased by special shaping of the molding as proposed in Japanese Kokai Publication Hei-06-244458, the system in which a 2-step concave is formed on the package for reducing the uneven distribution of luminance, the system in which the light emitting diode is inserted into a through-hole and fixed, the system providing the surface of the light emitting device with a thin film capable of absorbing light at shorter wavelengths than the main emission wavelength, and the system in which the light emitting device is connected to a lead part by flip-chip connection using a solder bump or the like and the light is taken out from the substrate direction, among others.

The light emitting diode of the invention can be used in a variety of known applications. Thus, for example, the backlight, illumination, sensor light source, meter light source for road vehicle use, signal lamp, indication lamp, indicator, planer illuminant, display, decoration, various lights, etc. may be mentioned.

BEST MODE FOR CARRYING OUT THE INVENTION

The following examples and comparative examples illustrate the present invention in further detail without defining the scope of the invention.

EXAMPLE OF SYNTHESIS—1

BPA-AE

A three-necked flask of 1 L capacity was fitted with a stirring apparatus and a condenser. This flask was charged with 114 g of bisphenol A, 145 g of potassium carbonate, 140 g of allyl bromide, and 250 mL of acetone and the mixture was stirred at 60° C. for 12 hours. The supernatant was taken and washed with aqueous solution of sodium hydroxide in a separatory funnel, following by washing with water. The organic layer was dehydrated over sodium sulfate and the solvent was removed under reduced pressure in an evaporator to recover 126 g of a light-yellow liquid. $^1$H-NMR analysis revealed that it was the bisphenol A diallyl ether produced by allyl etherification of the OH groups of bisphenol A. Yield 82%, purity ≧95%.

EXAMPLE OF SYNTHESIS—2

HBPA-AE

A four-necked flask of 500 mL capacity was fitted with a stirring apparatus and a condenser. This flask was charged with 6.49 g of 2,2-bis(4-hydroxycyclohexyl)propane (product of Tokyo kasei Kogyo Co., Ltd.), 243 g of 50 wt % aqueous solution of sodium hydroxide, 3.54 g of tetra-n-butylammonium bromide, 20.5 g of allyl chloride, and 16.0 mL of xylene, and the mixture was heated and stirred under nitrogen at 60° C. for 5 hours and then at 70° C. for 4 hours.

Using a separatory funnel, the organic layer was separated, washed once with 50 mL of 1N—HCl and 4 times with 200 mL of water, and dehydrated over magnesium sulfate. The solvent was then removed under reduced pressure in an evaporator at 60 to 70° C. to recover a light-yellow liquid. $^1$H-NMR analysis revealed that it was the 2,2-bis(4-hydroxycyclohexyl) propane diallyl ether produced by allyl etherification of the OH groups of hydrogenated bisphenol A.

EXAMPLE 1

TVCH

A four-necked flask of 1 L capacity was fitted with a stirring apparatus, a condenser, and a dropping funnel. This flask was charged with 190 g of toluene, 48 mg of platinum vinylsiloxane complex-in-xylene (platinum content 3 wt %), and 236.2 g of 1,3,5,7-tetramethylcyclotetrasiloxane and the mixture was heated and stirred on an oil bath at 70° C. To this solution was added a solution of 20.0 g of 1,2,4-trivinylcyclohexane (number of vinyl groups: 3, molecular weight: 162, viscosity: less than 1 poise) in 10 g of toluene dropwise over 1 hour. The resulting solution was heated and stirred on an oil bath at 70° C. for 90 minutes. Then, 9.2 mg of 1-ethynyl-1-cyclohexanol was added. The unreacted 1,3,5,7-tetramethylcyclotetrasiloxane and the toluene were then removed under reduced pressure. $^1$H-NMR analysis revealed that this was the reaction product of part of the SiH groups of 1,3,5,7-tetramethylcyclotetrasiloxane with 1,2,4-trivinylcyclohexane (This product is referred to briefly as partial reaction product A. While this partial reaction product A was a mixture, it contained the following compound having 9 SiH groups within the molecule as a main component).

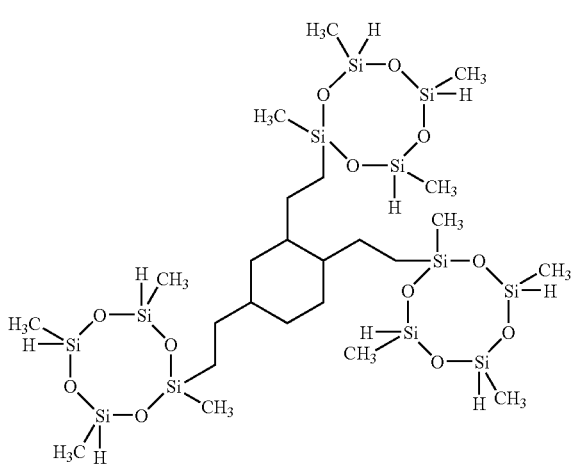

EXAMPLE 2

HBPAH

A two-necked flask of 200 mL capacity was fitted with a stirring apparatus, a condenser, and a dropping funnel. This flask was charged with 40.0 g of toluene and 36.0 g of 1,3,5,7-tetramethylcyclotetrasiloxane and the mixture was heated and stirred on an oil bath at 80° C. To this solution was added a mixture of 9.6 g of 2,2-bis(4-hydroxycyclohexyl)propane diallyl ether synthesized in Example of Synthesis-2 (number of vinyl groups: 2, molecular weight: 320, viscosity: less than 1 poise), 10.0 g of toluene, and 4.5 μl of platinum vinylsiloxane complex-in-xylene (platinum content: 3 wt. %) dropwise over 15 minutes. The resulting solution was heated and stirred on an oil bath at 80° C. for 30 minutes. Then, 7.5 mg of 1-ethynyl-1-cyclohexanol was added and the unreacted 1,3,5,7-tetramethylcyclotetrasiloxane and the toluene were removed under reduced pressure to recover 20.5 g of product. $^1$H-NMR analysis revealed that this was the reaction product of part of the SiH groups of 1,3,5,7-tetramethylcyclotetrasiloxane with 2,2-bis(4-hydroxycyclohexyl)propane diallyl ether (This product is referred to briefly as partial reaction product B. While this partial reaction product B was a mixture, it contained the following compound having 6 SiH groups within the molecule as a main component).

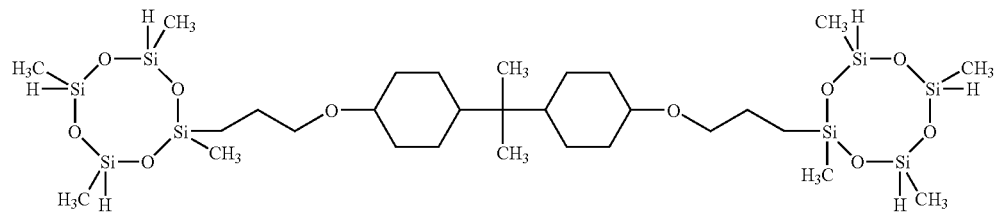

EXAMPLE 3

TAICH

A two-necked flask of 5 L capacity was fitted with a stirring apparatus, a condenser, and a dropping funnel. This flask was charged with 1,800 g of toluene and 1,440 g of 1,3,5,7-tetramethylcyclotetrasiloxane and the mixture was heated and stirred on an oil bath at 120° C. To this solution was added a mixture of 200 g of triallyl isocyanurate, 200 g of toluene, and 1.44 ml of platinum vinylsiloxane complex-in-xylene (platinum content: 3 wt. %) dropwise over 50 minutes. The resulting solution as such was heated and stirred for 6 hours. Then, 2.95 mg of 1-ethynyl-1-cyclohexanol was added and the unreacted 1,3,5,7-tetramethylcyclotetrasiloxane and the toluene were removed under reduced pressure to recover 724 g of product. $^1$H-NMR analysis revealed that this was the reaction product of part of the SiH groups of 1,3,5,7-tetramethylcyclotetrasiloxane with triallyl isocyanurate (This product is referred to briefly as partial reaction product C. While this partial reaction product C was a mixture, it contained the following compound having 9 SiH groups within the molecule as a main component).

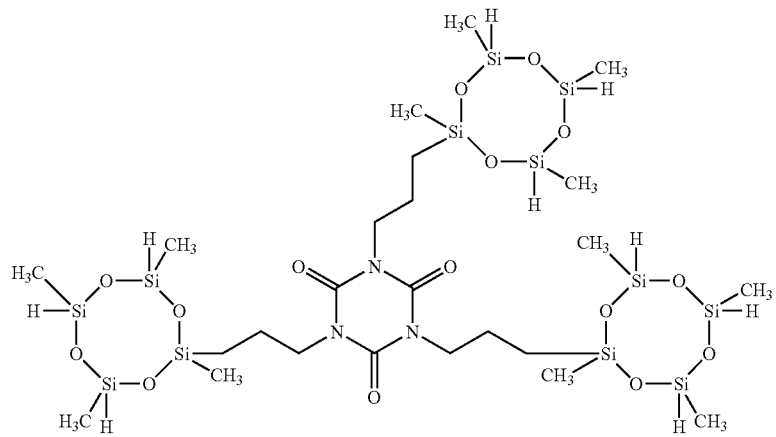

COMPARATIVE EXAMPLE 1

BPAH

A four-necked flask of 1 L capacity was fitted with a stirring apparatus, a condenser, and a dropping funnel. This flask was charged with 150 g of toluene, 15.6 μL of platinum vinylsiloxane complex-in-xylene (platinum content: 3 wt. %), and 500 g of 1,3,5,7-tetramethylcyclotetrasiloxane and the mixture was heated and stirred on an oil bath at 70° C. Then, 64 g of the bisphenol A diallyl ether prepared in Example of Synthesis-1 was diluted with 40 g of toluene and added dropwise from the dropping funnel. The mixture was stirred at the same temperature for 60 minutes and then allowed to cool, and 4.74 mg of benzothiazole was added. The unreacted 1,3,5,7-tetramethylcyclotetrasiloxane and the toluene were removed under reduced pressure to recover a slightly viscous liquid. $^1$H-NMR analysis revealed that this was the reaction product of part of the SiH groups of 1,3,5,7-tetramethylcyclotetrasiloxane with bisphenol A diallyl ether (This product is referred to briefly as partial reaction product D. While this partial reaction product D was a mixture, it contained the following compound having 6 SiH groups within the molecule as a main component).

ethylcyclotetrasiloxane, and 125 μL of platinum vinylsiloxane complex-in-xylene (platinum content: 3 wt. %) and the mixture was heated and stirred on an oil bath at 50° C. To this solution was added a mixture of 156 g of divinylbenzene (product of Nippon Steel Chemical Co., Ltd., DVB960) and 433 g of toluene was added dropwise over 25 minutes. The resulting solution as such was heated and stirred for 1 hour. Then, 275 mg of benzothiazole was added and the unreacted 1,3,5,7-tetramethylcyclotetrasiloxane and the toluene were removed under reduced pressure to recover 691 g of product. $^1$H-NMR analysis revealed that it was the reaction product of part of the SiH groups of 1,3,5,7-tetramethylcyclotetrasiloxane with triallyl isocyanurate (This product is referred to briefly as partial reaction product E. While this partial reaction product E was a mixture, it contained the following compound having 6 SiH groups within the molecule as a main component).

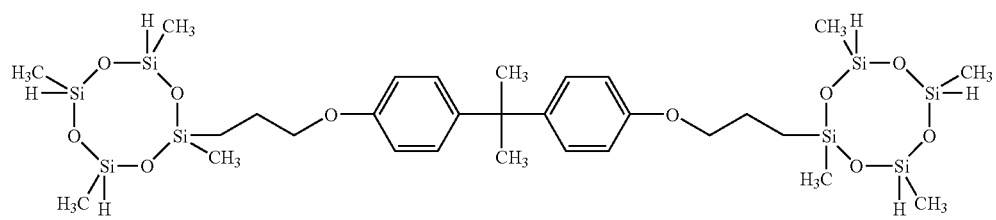

COMPARATIVE EXAMPLE 2

DVBH

A two-necked flask of 5 L capacity was fitted with a stirring apparatus, a condenser, and a dropping funnel. This flask was charged with 1,800 g of toluene, 1,440 g of 1,3,5,7-tetram-

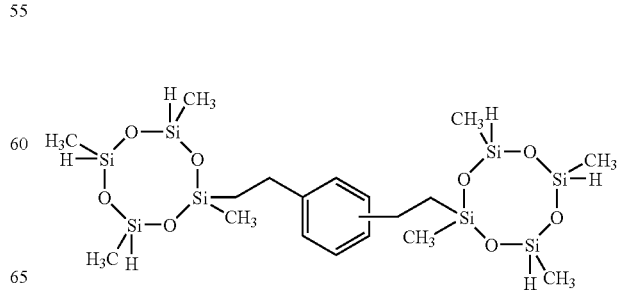

COMPARATIVE EXAMPLE 3

TAICDH

A four-necked flask of 5 L capacity was fitted with a stirring apparatus, a condenser, and a dropping funnel. This flask was charged with 900 g of toluene and 487.8 g of 1,1,3,3-tetramethyldisiloxane and the mixture was heated and stirred on an oil bath at 90° C. To this solution was added a mixture of 302.4 g of triallyl isocyanurate, 900 g of toluene, and 2.18 mL of platinum vinylsiloxane complex-in-xylene (platinum content: 3 wt. %) dropwise over 50 minutes. The resulting solution was heated and stirred on an oil bath at 110° C. for 4.5 hours. The unreacted 1,1,3,3-tetramethyldisiloxane and the toluene were removed under reduced pressure to recover 702 g of product. $^1$H-NMR analysis revealed that it was the reaction product of part of the SiH groups of 1,1,3,3-tetramethyldisiloxane with triallyl isocyanurate (This product is referred to briefly as partial reaction product F. While this partial reaction product F was a mixture, it contained the following compound having 3 SiH groups within the molecule as a main component).

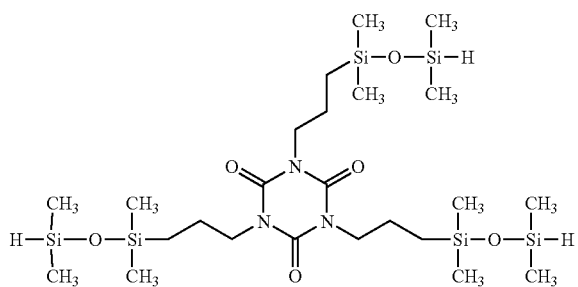

EXAMPLES 4 TO 13

The component materials were blended in the formulating ratio shown in Table 1. The mixture was poured into a cell prepared by disposing a 3 mm-thick silicone rubber sheet between two glass sheets as a spacer and heated stepwise according to the schedule of 60° C./6 hr, 70° C./1 hr, 80° C./1 hr, 120° C./1 hr, and 150° C./1 hr to prepare a visually homogeneous and generally colorless transparent cured sheet.

COMPARATIVE EXAMPLES 4 TO 7

AE·BPAH, TAIC·TAICDH

The component materials were blended according to the formulating ratio shown in Table 1. The mixture was poured into a cell prepared by disposing a 3 mm-thick silicone rubber sheet between two glass sheets as a spacer and heated stepwise according to the schedule of 60° C./6 hr, 70° C./1 hr, 80° C./1 hr, 120° C./1 hr, and 150° C./1 hr to prepare a visually homogeneous and generally colorless transparent cured sheet.

The various initial physical properties of the cured artifacts prepared in Examples 4 to 13 and Comparative Examples 4 to 7 were determined. In addition, for evaluation of light resistance, each cured artifact was irradiated for 110 hours using SX120 Xenon Weather Meter (Suga Test Instruments Co., Ltd.) (black panel temperature: 63° C., 18 minutes' rainfall during 2 hours of irradiation) and the light transmittance and degree of yellowness were measured. The results were presented in Table 1.

Physical state: The 3 mm-thick sheet sample with a Shore D hardness of not less than 70 at 23° C. was rated "Rigid" and the sample with a Shore D hardness of less than 70 at 23° C. was rated "Soft".

Glass transition temperature: Using a 3 mm×5 mm×30 mm prismatic testpiece, the dynamic viscoelasticity was measured using the pulling mode, measuring frequency of 10 Hz, strain 0.1%, static/dynamic power ratio 1.5, temperature increasing rate 5° C./min. (IT KEISOKU SEIGYO Co. (IT Instrument and Control Co.), DVA-200) and the result was expressed in tan δ peak temperature.

Light transmittance: Using a spectrophotometer (Hitachi U-3300, spectrophotometer), a 3 mm-thick sheet sample was measured at 23° C. and the result was expressed in the transmittance of light at a wavelength of 470 nm.

Degree of yellowness: Using a calorimeter (Nippon Denshoku Industries Co., Ltd., Spectro-colorimeter SE-2000), a 3 mm-thick sheet sample was measured at 23° C. and the result was expressed in the degree of yellowness on the transmission mode.

TABLE 1

| (Formulating ratio by weight) | Examples | | | | | | | | | | Comparative Examples | | | |
|---|---|---|---|---|---|---|---|---|---|---|---|---|---|---|
| | 4 | 5 | 6 | 7 | 8 | 9 | 10 | 11 | 12 | 13 | 4 | 5 | 6 | 7 |
| Component A | | | | | | | | | | | | | | |
| 1,2,4-Trivinylcyclohexane | 9.23 | — | 6.61 | — | — | — | 8.23 | — | — | — | — | — | — | — |
| 2,2-Bis (4-hydroxycyclohexyl) propane diallyl ether | — | 16.37 | — | 13.22 | — | — | — | 15.25 | — | — | — | — | — | — |
| Triallyl isocyanurate | — | — | — | — | 8.97 | — | — | — | 14.99 | — | — | — | 4.00 | 4.28 |
| Bisphenol A diallyl ether | — | — | — | — | — | 12.96 | — | — | — | 10.86 | 14.49 | 16.11 | — | — |
| Component B | | | | | | | | | | | | | | |
| Partial reaction product A | 17.77 | 10.63 | — | — | — | — | — | — | — | — | — | — | — | — |
| Partial reaction product B | — | — | 20.39 | 13.78 | 18.03 | 19.43 | — | — | — | — | — | — | — | — |
| Partial reaction product C | — | — | — | — | — | — | 18.77 | 11.75 | 12.01 | 16.14 | — | — | — | — |
| Partial reaction product D | — | — | — | — | — | — | — | — | — | — | 12.51 | — | — | — |
| Partial reaction product E | — | — | — | — | — | — | — | — | — | — | — | 10.89 | — | — |
| Partial reaction product F | — | — | — | — | — | — | — | — | — | — | — | — | 16.04 | 11.12 |

TABLE 1-continued

| (Formulating ratio by weight) | Examples | | | | | | | | | | Comparative Examples | | | |
|---|---|---|---|---|---|---|---|---|---|---|---|---|---|---|
| | 4 | 5 | 6 | 7 | 8 | 9 | 10 | 11 | 12 | 13 | 4 | 5 | 6 | 7 |
| Component C | | | | | | | | | | | | | | |
| Platinum vinylsiloxane complex-in-xylene (Pt content 3 wt %) | — | 0.0021 | — | 0.0034 | 0.0444 | — | 0.0125 | 0.0157 | 0.0080 | 0.0538 | — | — | 0.0200 | 0.0154 |
| Others | | | | | | | | | | | | | | |
| Cure retardant: 1-ethynyl-1-cyclohexanol | — | 0.0011 | — | 0.0018 | 0.0240 | — | 0.0068 | 0.0085 | 0.0043 | 0.0290 | — | — | 0.0601 | 0.0462 |
| Initial | | | | | | | | | | | | | | |
| Physial state at room temperature | Rigid | Rigid | Rigid | Rigid | Rigid | Rigid | Rigid | Rigid | Rigid | Rigid | Rigid | Rigid | Soft | Soft |
| Glass transition temperature (° C.) | 69 | 73 | 78 | 77 | 126 | 77 | 107 | 103 | 149 | 109 | 72 | 90 | 36 | 23 |
| Light transmittance (%) | 92 | 92 | 92 | 92 | 89 | 89 | 90 | 91 | 89 | 89 | 86 | 89 | 89 | 86 |
| Degree of yellowness | 1.4 | 1.5 | 1.0 | 1.2 | 2.1 | 2.4 | 4.0 | 1.5 | 1.3 | 2.4 | 3.6 | 3.3 | 2.3 | 3.7 |
| After irradiation | | | | | | | | | | | | | | |
| Light transmittance (%) | 91 | 90 | 90 | 87 | 87 | 84 | 89 | 86 | 89 | 86 | 84 | 85 | 87 | 70 |
| Degree of yellowness | 2.5 | 3.7 | 3.7 | 4.7 | 4.8 | 8.2 | 4.2 | 4.6 | 2.4 | 7.7 | 9.0 | 9.5 | 2.9 | 15.1 |

It will be apparent from Table 1 that the cured artifact obtained from the curable composition of the invention has not only a comparatively high glass transition temperature with high heat resistance but also high optical transparency and high light resistance.

EXAMPLE 14

Using MOCVD (metalorganic chemical vapor deposition) technique, an n-type GaN layer as an un-doped nitride semiconductor, a GaN layer formed with Si-doped n-type electrode and serving as an n-type contact layer, an n-type GaN layer which is an un-doped nitride semiconductor, a GaN layer serving as a barrier layer, an InGaN layer constituting a well layer, a GaN layer serving as a barrier layer, above three layers constitute a light emission layer (quantum well structure), and on the light emission layer, an AlGaN layer as a Mg-doped p-type cladding layer and a GaN layer which is a Mg-doped p-type contact layer are serially built up on a washed sapphire substrate. The nitride semiconductors on the sapphire substrate are etched on the same side to expose both the p and n contact layer surfaces. On each contact layer, Al is deposited by sputtering to form positive and negative electrodes. The semiconductor wafer thus prepared is scribed and broken by applying an external force to give light emitting devices.

Onto the cup bottom surface of a mount lead made of iron-containing copper having a silver plated surface, the above light emitting device is die-bonded using an epoxy resin composition as die-bonding agent. The epoxy resin composition is then cured by heating at 170° C. for 75 minutes to secure the light emitting device. Then, the positive and negative electrodes of the light emitting device are wire-bonded to the mount lead and inner lead with Au wires for electrical connection.

The curable composition prepared in the same manner as in Examples 4 to 13 is dispensed into a casting case which is a cannonball-shaped frame. The mount lead with said light emitting device disposed within the cup and the inner lead are partially inserted into the casting case and initial curing is performed at 100° C. for 1 hour. The light emitting diode is withdrawn from the casting case and cured in a nitrogen atmosphere at 120° C. for 1 hour. By the above procedure can a cannonball-shaped lamp type light emitting diode be produced.

EXAMPLE 15

A curable composition and light emitting devices are fabricated by the methods described in Examples 4 to 14.

A pair of copper-foil patterns are formed on a glass-epoxy resin by etching to form a substrate equipped with lead electrodes. Using an epoxy resin, the light emitting device is die-bonded onto the glass-epoxy resin. Each of the electrodes of the light emitting devices is wire-bonded to the corresponding lead electrode with Au wires for electrical connection. The glass epoxy resin having a through-hole serving as a mask and a side wall is rigidly disposed on the substrate with an epoxy resin. It is then disposed as such in a vacuum unit and, at the same time, the curable composition is dispensed onto the glass-epoxy resin substrate carrying the light emitting devices to fill the cavity with the curable composition by utilizing the through-hole. In this state, the composition is cured at 100° C. for 1 hour and further at 150° C. for 1 hour. By dividing it into light emitting diode chips, chip type light emitting diodes can be provided.

EXAMPLE 16

A curable composition and light emitting devices are fabricated by the methods described in Examples 4 to 14.

Using a PPS resin, a chip type light emitting diode package is constructed by insert molding. In the package, a silver-plated copper plate with apertures for accepting light emitting devices is disposed as an external electrode. Within the package, the light emitting device is secured in position by die bonding with an epoxy resin. An Au wire which is electrically conductive is wire-bonded to each of the electrodes of light emitting devices and the corresponding external electrode of the package for electrical connection. The apertures of the package are filled with a curable composition as a molding material. In this condition, the resin is cured at 100° C. for 1 hour and further at 150° C. for 1 hour. In this manner, chip type light emitting diodes can be produced.

INDUSTRIAL APPLICABILITY

The materials produced from the composition of the invention are materials having high heat resistance and high optical transparency, as well as light resistance.

What is claimed is:

1. A curing agent,
   which comprises at least two SiH groups in each molecule which is obtainable by subjecting
   at least one of 1,2,4-trivinylcyclohexane and 2,2-bis(4-hydroxycyclohexyl)propane diallyl ether (α1) and
   a cyclic polyorganosiloxane (β1) having at least two SiH groups in each molecule
   to hydrosilylation reaction.

2. A curing agent,
   which comprises at least two SiH groups in each molecule which is obtainable by subjecting
   an organic compound (α2) represented by the following general formula (I)

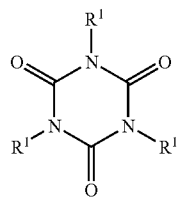

(I)

wherein $R^1$ represents a univalent organic group of 1 to 50 carbon atoms and the respective $R^1$s may be different or the same, and
   a cyclic polyorganosiloxane (β2) having at least two SiH groups in each molecule to hydrosilylation reaction.

3. A curable composition,
   which comprises
   an organic compound (A) containing no siloxane unit and having at least two carbon-carbon double bonds capable of reacting with a SiH group in each molecule,
   a curing agent (B1), and
   a hydrosilylation catalyst (C),
   wherein said curing agent (B1) comprises at least two SiH groups in each molecule, which is obtainable by subjecting at least one of 1,2,4-trivinylcyclohexane and 2,2-bis(4-hydroxycyclohexyl)propane diallyl ether (α1), and a cyclic polyorganosiloxane (β1) having at least two SiH groups in each molecule to hydrosilylation reaction.

4. A curable composition,
   which comprises
   an organic compound (A) having at least two carbon-carbon double bonds capable of reacting with a SiH group in each molecule,
   the curing agent (B2) according to claim 2, and
   a hydrosilylation catalyst (C).

5. The curable composition according to claim 3,
   wherein the compound (A) is an organic compound represented by the following general formula (I)

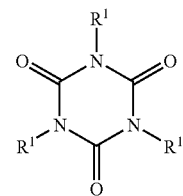

(I)

wherein $R^1$ represents a univalent organic group of 1 to 50 carbon atoms and the respective $R^1$s may be different or the same.

6. The curable composition according to claim 5,
   wherein at least two of the three $R^1$s in the general formula (I) representing the compound (A) are groups represented by the following general formula (II)

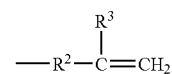

(II)

wherein $R^2$ represents a direct bond or a bivalent organic group of 1 to 48 carbon atoms; $R^3$ represents a hydrogen atom or a methyl group; $R^2$ and $R^3$ each in a plurality of occurrences may be different or the same.

7. The curable composition according to claim 5,
   wherein at least two of the three $R^1$s in the general formula (I) representing the compound (A) are allyl groups.

8. The curable composition according to claim 3,
   wherein the compound (A) is an organic compound having at least one vinyl group capable of reacting with a SiH group in each molecule.

9. The curable composition according to claim 3,
   wherein the compound (A) is an organic compound having at least one allyl group capable of reacting with a SiH group in each molecule.

10. The curable composition according to claim 3,
    wherein the compound (A) is an organic compound containing 1 to 6 vinyl groups in each molecule and having a molecular weight of less than 900 and a viscosity of less than 1,000 poises.

11. The curable composition according to claim 3,
    wherein the compound (A) is at least one compound selected from the group consisting of polybutadiene, vinylcyclohexene, cyclopentadiene, dicyclopentadiene, divinylbiphenyl, bisphenol A diallyl ether, triallyl isocyanurate, and trivinylcyclohexane.

12. A composition for optical material,
    which comprises the curable composition according to claim 3.

13. The composition for optical material according to claim 12,
    wherein the optical material is a film for liquid crystal.

14. The composition for optical material according to claim 12,
    wherein the optical material is a plastic cell for liquid crystal.

15. The composition for optical material according to claim 12,
    wherein the optical material is a sealant for LED.

16. An optical material,
which is obtainable by curing the composition for optical material according to claim 12.

17. A method of producing the optical material, which is obtainable by curing the composition for optical material according to claim 12,
which comprises mixing the composition for optical material according to claim 12 in advance and subjecting carbon-carbon double bonds capable of reacting with a SiH group to a reaction with some or all of SiH groups within the composition.

18. A liquid crystal display,
which comprises the optical material according to claim 16.

19. An LED,
which comprises the optical material according to claim 16.

20. A curable composition,
which comprises
an organic compound (A) having at least two carbon-carbon double bonds capable of reacting with a SiH group in each molecule,
a curing agent (B1), and
a hydrosilylation catalyst (C),
wherein the compound (A) is at least one compound selected from the group consisting of vinylcyclohexene, cyclopentadiene, dicyclopentadiene, divinylbiphenyl, bisphenol A diallyl ether, triallyl isocyanurate, and trivinylcyclohexane; and
the curing agent (B1) comprises at least two SiH groups in each molecule which is obtainable by subjecting
an aliphatic organic compound (α1) having at least two carbon-carbon double bonds capable of reacting with a SiH group in each molecule, said organic compound containing 1 to 6 vinyl groups in each molecule, and having a molecular weight of less than 900 and a viscosity of less than 1,000 poises and
at least one of an acyclic and a cyclic polyorganosiloxane (β1) having at least two SiH groups in each molecule
to hydrosilylation reaction.

21. An optical material,
which is obtainable by curing a curable composition,
wherein said curable composition comprises
an organic compound (A) having at least two carbon-carbon double bonds capable of reacting with a SiH group in each molecule,
a curing agent (B1), and
a hydrosilylation catalyst (C);
wherein the curing agent (B1) comprises at least two SiH groups in each molecule which is obtainable by subjecting
an aliphatic organic compound (α1) having at least two carbon-carbon double bonds capable of reacting with a SiH group in each molecule, said organic compound containing 1 to 6 vinyl groups in each molecule, and having a molecular weight of less than 900 and a viscosity of less than 1,000 poises and
at least one of an acyclic and a cyclic polyorganosiloxane (β1) having at least two SiH groups in each molecule
to hydrosilylation reaction.

22. The curable composition according to claim 4,
wherein the compound (A) is an organic compound represented by the following general formula (I)

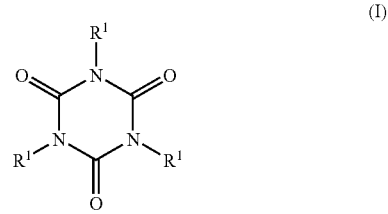

(I)

wherein $R^1$ represents a univalent organic group of 1 to 50 carbon atoms and the respective $R^1$s may be different or the same.

23. The curable composition according to claim 22,
wherein at least two of the three $R^1$s in the general formula (I) representing the compound (A) are groups represented by the following general formula (II)

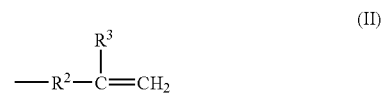

(II)

wherein $R^2$ represents a direct bond or a bivalent organic group of 1 to 48 carbon atoms; $R^3$ represents a hydrogen atom or a methyl group; $R^2$ and $R^3$ each in a plurality of occurrences may be different or the same.

24. The curable composition according to claim 22,
wherein at least two of the three $R^1$s in the general formula (I) representing the compound (A) are allyl groups.

25. The curable composition according to claim 4,
wherein the compound (A) is an organic compound having at least one vinyl group capable of reacting with a SiH group in each molecule.

26. The curable composition according to claim 4,
wherein the compound (A) is an organic compound having at least one allyl group capable of reacting with a SiH group in each molecule.

27. The curable composition according to claim 4,
wherein the compound (A) is an organic compound containing 1 to 6 vinyl groups in each molecule and having a molecular weight of less than 900 and a viscosity of less than 1,000 poises.

28. The curable composition according to claim 4,
wherein the compound (A) is at least one compound selected from the group consisting of polybutadiene, vinylcyclohexene, cyclopentadiene, dicyclopentadiene, divinylbiphenyl, bisphenol A diallyl ether, triallyl isocyanurate, and trivinylcyclohexane.

* * * * *